US012294387B2

(12) United States Patent
Choukroun et al.

(10) Patent No.: US 12,294,387 B2
(45) Date of Patent: May 6, 2025

(54) DECODING OF ERROR CORRECTION CODES BASED ON REVERSE DIFFUSION

(71) Applicant: Ramot at Tel-Aviv University Ltd., Tel-Aviv (IL)

(72) Inventors: Yoni Choukroun, Tel-Aviv (IL); Lior Wolf, Tel-Aviv (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 0 days.

(21) Appl. No.: 18/223,121

(22) Filed: Jul. 18, 2023

(65) Prior Publication Data
US 2024/0039559 A1 Feb. 1, 2024

Related U.S. Application Data

(60) Provisional application No. 63/389,963, filed on Jul. 18, 2022.

(51) Int. Cl.
| | | |
|---|---|---|
| *H03M 13/15* | (2006.01) | |
| *H03M 13/00* | (2006.01) | |
| *H03M 13/11* | (2006.01) | |

(52) U.S. Cl.
CPC ... *H03M 13/1575* (2013.01); *H03M 13/1108* (2013.01); *H03M 13/6597* (2013.01)

(58) Field of Classification Search
CPC ......... H03M 13/1575; H03M 13/1108; H03M 13/03; H03M 13/6597; H04L 1/0045; G06N 3/045; G06N 3/084
See application file for complete search history.

(56) References Cited

U.S. PATENT DOCUMENTS

| | | | | |
|---|---|---|---|---|
| 9,197,461 | B1* | 11/2015 | Sun | ........................ H04B 7/024 |
| 10,691,537 | B2* | 6/2020 | Sun | ..................... H03M 13/356 |
| 11,568,214 | B2* | 1/2023 | Tullberg | .................. G06N 5/01 |
| 2018/0357530 | A1* | 12/2018 | Beery | ................... H04L 1/0045 |

(Continued)

OTHER PUBLICATIONS

Y. Zhang, X. Ding, G. Li, Z. Zhang and K. Yang, "Offline Real-World Wireless Interference Signal Classification Algorithm Utilizing Denoising Diffusion Probability Model," in IEEE Signal Processing Letters, vol. 30, pp. 1132-1136, 2023 (Year: 2023).*

(Continued)

*Primary Examiner* — Cynthia Britt

(57) ABSTRACT

Disclosed herein are systems and method for training neural network based decoders for decoding error correction codes, comprising obtaining a plurality of training samples comprising one or more codewords encoded using an error correction code and transmitted over a transmission channel where the training samples are subject to gradual interference over a plurality of time steps and associate the encoded codeword(s) with an interference level and a parity check syndrome at each of the plurality of time steps, using the training samples to train a neural network based decoder to decode codewords encoded using an error correction code by (1) estimating a multiplicative interference included in the encoded codeword(s) based on reverse diffusion applied to the encoded codeword(s) across the time steps, (2) computing an additive interference included in the encoded codewords based on the multiplicative interference, and (3) recovering the codeword(s) by removing the additive interference.

8 Claims, 16 Drawing Sheets

(56) References Cited

U.S. PATENT DOCUMENTS

2021/0383207 A1* 12/2021 Beery .................. G06N 3/047
2024/0256862 A1* 8/2024 Chen ..................... G06N 3/08

OTHER PUBLICATIONS

Arikan "Channel Polarization: A Method for Constructing Capacity-Achieving Codes", IEEE Transactions on Information Theory, 55(7): 3051-3073, Jul. 2009.
Bennatan et al. "Deep Learning for Decoding of Linear Codes-A Syndrome-Based Approach", 2018 IEEE International Symposium on Information Theory, ISIT, Vail, CO, USA, Jun. 17-22, 2018, p. 1595-1599, Jun. 17, 2018.
Bose et al. "On A Class of Error Correcting Binary Group Codes", Information and Control, 3(1): 68-79, 1960.
Buchberger et al. "Learned Decimation for Neural Belief Propagation Decoders", ArXiv Preprint ArXiv:2011.02161v1, Nov. 4, 2020.
Cammerer et al. "Scaling Deep Learning-Based Decoding of Polar Codes Via Partitioning", Globecom 2017-2017 IEEE Global Communications Conference, Singapore, Dec. 4-8, 2017, p. 1-6, Dec. 4, 2017.
Chen et al. "Wavegrad: Estimating Gradients for Waveform Generation", ArXiv Preprint ArXiv:2009.00713v1, Sep. 2, 2020.
Chen et al. "Wavegrad: Estimating Gradients for Waveform Generation", ArXiv Preprint ArXiv:2009.00713v2, Oct. 9, 2020.
Choukroun et al. "Geometric Transformer for End-to-End Molecule Properties Prediction", ArXiv Preprint ArXiv:2110.13721v1, Oct. 26, 2021.
Devlin et al. "BERT: Pre-Training of Deep Bidirectional Transformers for Language Understanding", ArXiv Preprint ArXiv:1810.04805v1, Oct. 11, 2018.
Dhariwal et al. "Diffusion Models Beat Gans on Image Synthesis", Advances in Neural Information Processing Systems, 35th Conference on Neural Information Processing Systems, NeurIPS 2021, 34: 8780-8794, Dec. 6, 2021.
Dosovitskiy et al. "An Image Is Worth 16×16 Words: Transformers for Image Recognition at Scale", ArXiv Preprint ArXiv:2010.11929v1, Oct. 22, 2020.
Gallager "Low-Density Parity-Check Codes", IRE Transactions on Information Theory, 8(1): 21-28, Jan. 1, 1962.
Gruber et al. "On Deep Learning-Based Channel Decoding", 2017 51st Annual Conference on Information Sciences and Systems, CISS, Baltimore, MD, USA, Mar. 22- 24, 2017, p. 1-6, Mar. 22, 2017.
Helmling et al. "Database of Channel Codes and ML Simulation Results", Technische Universität Kaiserslautern, TU Kaiserslautern, ID: 13641, 2 P., Last Revised May 17, 2022.
Ho et al. "Denoising Diffusion Probabilistic Models", ArXiv Preprint ArXiv:2006.11239v1, Jun. 19, 2020.
Ho et al. "Denoising Diffusion Probabilistic Models", ArXiv Preprint ArXiv:2006.11239v2, Dec. 16, 2020.
Hyvaerinen et al. "Estimation of Non-Normalized Statistical Models by Score Matching", Journal of Machine Learning Research, 6(4): 695-709, May 4, 2005.
Ibnkahla "Applications of Neural Networks to Digital Communications—A Survey", Signal Processing, 80(7): 1185-1215, Jul. 2000.
Kim et al. "Communication Algorithms Via Deep Learning", Sixth International Conference on Learning Representations, ICLR 2018, Vancouver, Canada, Apr. 30, 03 May 2018, p. 1-17, Apr. 30, 2018.
Kingma et al. "Adam: A Method for Stochastic Optimization", ArXiv Preprint ArXiv:1412.6980v1, Dec. 22, 2014.
Klein et al. "OpenNMT: Open-Source Toolkit for Neural Machine Translation", Proceedings of the 55th Annual Meeting of the Association for Computational Linguistics-System Demonstrations, ACL, Vancouver, Canada, Jul. 30-Aug. 4, 2017, p. 67-72, Jul. 30, 2017.
Kong et al. "Diffwave: A Versatile Diffusion Model for Audio Synthesis", ArXiv Preprint ArXiv:2009.09761v1, Sep. 21, 2020.
Lin et al. "A Survey of Transformers", ArXiv Preprint ArXiv:2106.04554v1, Jun. 8, 2021.
Liu et al. "TERA: Self-Supervised Learning of Transformer Encoder Representation for Speech", IEEE/ACM Transactions on Audio, Speech, and Language Processing, 29: 2351-2366, Jul. 8, 2021, ArXiv Preprint ArXiv:2007.06028.v3, Aug. 4, 2021.
Lugosch et al. "Neural Offset Min-Sum Decoding", 2017 IEEE International Symposium on Information Theory, ISIT, Aachen, Germany, Jun. 25-30, 2017, p. 1361-1365, Jun. 25, 2017.
Nachmani et al. "Autoregressive Belief Propagation for Decoding Block Codes", ArXiv Preprint ArXiv:2103.11780v1, Jan. 23, 2021.
Nachmani et al. "Deep Learning Methods for Improved Decoding of Linear Codes", IEEE Journal of Selected Topics in Signal Processing, 12(1): 119-131, Published Online Jan. 1, 2018.
Nachmani et al. "Hyper-Graph-Network Decoders for Block Codes", NIPS'19: Proceedings of the 33rd International Conference on Neural Information Processing Systems, Art.209: 2326-2336, Dec. 2019.
Nachmani et al. "Learning to Decode Linear Codes Using Deep Learning", 2016 54th Annual Allerton Conference on Communication, Control, and Computing, Allerton, Monticello, Ill., USA, Sep. 27-30, 2016, p. 341-346, Sep. 27, 2016.
Nichol et al. "Improved Denoising Diffusion Probabilistic Models", ArXiv Preprint ArXiv:2102.09672v1, Feb. 18, 2021.
Nichol et al. "Improved Denoising Diffusion Probabilistic Models", Proceedings of the 38th International Conference on Machine Learning, PMLR 139: 8162-8171, Jul. 1, 2021.
Nocedal et al. "Line Search Methods", Springer Series in Operations Research and Financial Engineering, Numerical Optimization, 2nd Ed., Chap.3: 30-65, 2006.
O'Shea et al. "An Introduction to Machine Learning Communications Systems", ArXiv Preprint ArXiv:1702.00832v1, Feb. 2, 2017.
Raviv et al. "Perm2vec: Graph Permutation Selection for Decoding of Error Correction Codes Using Self-Attention", ArXiv Preprint ArXiv:2002.02315v1, Feb. 6, 2020.
Richardson et al. "Design of Capacity-Approaching Irregular Low-Density Parity-Check Codes", IEEE Transactions on Information Theory, 47(2): 619-637, Feb. 2001.
Saharia et al. "Image Super-Resolution Via Iterative Refinement", ArXiv Preprint ArXiv:2104.07636v1, Apr. 15, 2021.
San-Roman et al. "Noise Estimation for Generative Diffusion Models", ArXiv Preprint ArXiv:2104.02600v1, Apr. 6, 2021.
Shazeer "GLU Variants Improve Transformer", ArXiv Preprint ArXiv:2002.05202v1, Feb. 12, 2020.
Sohl-Dickstein et al. "Deep Unsupervised Learning Using Nonequilibrium Thermodynamics", Proceedings of the 32nd International Conference on Machine Learning, Lille, France, PMLR 37: 2256-2265, 2015.
Song et al. "Denoising Diffusion Implicit Models", ArXiv Preprint ArXiv:2010.02502v1, Oct. 6, 2020.
Song et al. "Generative Modeling by Estimating Gradients of the Data Distribution", ArXiv Preprint ArXiv:1907.05600v1, Jul. 12, 2019.
Song et al. "Score-Based Generative Modeling Through Stochastic Differential Equations", ArXiv Preprint ArXiv:2011.13456v2, Feb. 10, 2021.
Vaswani et al. "Attention Is All You Need", NIPS'17: Proceedings of the 31st International Conference on Neural Information Processing Systems, Long Beach, CA, USA, p. 5998-6008, Jul. 17, 2017.
Wang et al. "An Artificial Neural Net Viterbi Decoder", IEEE Transactions on Communications, 44(2): 165-171, Feb. 1996.
Welling et al. "Bayesian Learning Via Stochastic Gradient Langevin Dynamics", Proceedings of the 28th International Conference on Machine Learning, ICML'11, Bellevue, WA, USA, p. 681-688, Jun. 28, 2011.
Xiong et al. "On Layer Normalization in the Transformer Architecture", ArXiv Preprint ArXiv:2002.04745v1, Feb. 12, 2020.

* cited by examiner

DECODING OF ERROR CORRECTION CODES BASED ON REVERSE DIFFUSION

RELATED APPLICATIONS

This application claims the benefit of priority under 35 USC § 119(e) of U.S. Provisional Patent Application No. 63/389,963 filed on Jul. 18, 2022, the contents of which are all incorporated by reference as if fully set forth herein in their entirety.

The project leading to this patent application has received funding from the European Research Council (ERC) under the European Union's Horizon 2020 research and innovation program (grant agreement no. 725974).

FIELD AND BACKGROUND OF THE INVENTION

The present invention, in some embodiments thereof, relates to training and using neural networks to decode error correction codewords transmitted over transmission channels subject to interference, and, more specifically, training and using neural networks which employ reverse diffusion to decode error correction codewords transmitted over transmission channels subject to interference.

Transmission of data over transmission channels, either wired and/or wireless is an essential building block for most modern era data technology applications, for example, communication channels, network links, memory interfaces, components interconnections (e.g. bus, switched fabric, etc.) and/or the like.

However, such transmission channels are typically subject to interferences such as, for example, noise, crosstalk, attenuation, etc. which may degrade the transmission channel performance for carrying the communication data and may lead to loss of data at the receiving side.

One of the most commonly used methods to overcome this is to encode the data with error correction information which may allow the receiving side to detect and possibly correct errors in the received encoded data.

Such methods may utilize one or more Error Correction Codes (ECC) and/or models as known in the art, for example, linear block codes such as, for example, algebraic linear code, polar code, Low Density Parity Check (LDPC) and High Density Parity Check (HDPC) codes as well as non-block codes such as, for example, convolutional codes and/or non-linear codes, such as, for example, Hadamard code.

In parallel, research, use and deployment of machine learning and Deep Learning (DL) methods has increased dramatically in recent years and demonstrate significant improvements in various applications and tasks including in the field of error correction codes

SUMMARY OF THE INVENTION

It is an object of the present invention to provide, methods, systems and software program products for decoding error correction codes. The foregoing and other objects are achieved by the features of the independent claims. Further implementation forms are apparent from the dependent claims, the description and the figures.

According to a first aspect of the present invention there is provided a method of training a neural network based decoder for decoding error correction codes, comprising using one or more processors for:

Obtaining a plurality of training samples comprising one or more codewords encoded using an error correction code and transmitted over a transmission channel. The plurality of training samples are subject to gradual interference over a plurality of time steps and associate the one or more encoded codewords with an interference level and a parity check syndrome at each of the plurality of time steps.

Using the plurality of training samples to train a neural network based decoder to decode codewords encoded using an error correction code by:

Estimating a multiplicative interference included in the one or more encoded codewords based on reverse diffusion applied to the one or more encoded codewords across the plurality of time steps.

Computing an additive interference included in the one or more encoded codewords based on the estimated multiplicative interference.

Recovering the one or more codewords by removing the additive interference; and

Outputting the trained neural network based decoder for decoding one or more codewords encoded using an error correction code.

According to a second aspect of the present invention there is provided a system for training a neural network based decoder for decoding error correction codes, comprising one or more processors configured to execute a code. The code comprising:

Code instructions to obtain obtaining a plurality of training samples comprising one or more codewords encoded using an error correction code and transmitted over a transmission channel. The plurality of training samples are subject to gradual interference over a plurality of time steps and associate the one or more encoded codewords with an interference level and a parity check syndrome at each of the plurality of time steps.

Code instructions to use the plurality of training samples to train a neural network based decoder to decode codewords encoded using an error correction code by:

Estimating a multiplicative interference included in the one or more encoded codewords based on reverse diffusion applied to the one or more encoded codewords across the plurality of time steps.

Computing an additive interference included in the one or more encoded codewords based on the estimated multiplicative interference.

Recovering the one or more codewords by removing the additive interference; and

Code instructions to output the trained neural network based decoder for decoding one or more codewords encoded using an error correction code.

According to a third aspect of the present invention there is provided a method of using a neural network based decoder trained for decoding error correction codes, comprising using one or more processors for:

Receiving one or more codewords encoded using an error correction code and transmitted over a transmission channel.

Recovering the one or more encoded codewords by applying to it one or more neural network based decoders trained to decode codewords encoded using the error correction code.

Outputting the one or more recovered codewords;

Wherein the one or more neural network based decoders are trained using a plurality of training samples. The plurality of training samples comprise one or more codewords encoded using the error correction code and transmitted over a transmission channel. The plurality of training samples are subject to gradual interference over a plurality of time steps and associate the one or more encoded codewords with an interference level and a parity check syndrome at each of the plurality of time steps. The one or more neural network based decoders are trained to decode the one or more encoded codeword by:

Estimating a multiplicative interference included in the one or more encoded codewords based on reverse diffusion applied to the one or more encoded codewords across the plurality of time steps.

■Computing an additive interference included in the one or more encoded codewords based on the estimated multiplicative interference.

Recovering the one or more codewords by removing the additive interference; and

According to a fourth aspect of the present invention there is provided a transformer neural network based decoder for decoding error correction codes, comprising:

An input layer configured for creating embeddings for a plurality of bits of a received codeword encoded using an error correction code and transmitted over a transmission channel subject to interference.

A plurality of decoding layers each comprising a self-attention layer comprising one or more heads constructed according to a mask indicative of a relation between embeddings corresponding to each data bit of the error correction code and embeddings of each other bit of the error correction code. The mask created based on a parity check matrix of the error correction code is adapted to unmask pairs of connected bits and mask pairs of unconnected bits.

An output layer.

Wherein the plurality of decoding layers are trained to decode the received codeword by predicting the interference based on the relation between connected bits while ignoring the unconnected bits.

According to a fifth aspect of the present invention there is provided a method of using a transformer neural network based decoder for decoding error correction codes, comprising:

Receiving one or more codewords encoded using an error correction code and transmitted over a transmission channel subject to interference.

Applying a trained neural network based decoder to recover the at last one received codeword, the trained neural network based decoder is constructed of:

An input layer configured for creating embeddings for a plurality of bits of a received codeword encoded.

A plurality of decoding layers each comprising a self-attention layer comprising one or more heads constructed according to a mask indicative of a relation between embeddings corresponding to each data bit of the error correction code and embeddings of each other bit of the error correction code. The mask created based on a parity check matrix of the error correction code is adapted to unmask pairs of connected bits and mask pairs of unconnected bits. The plurality of decoding layers are trained to decode the at last one codeword by predicting the interference based on the relation between.

An output layer; and

Outputting the at last one codeword recovered by the neural network based decoder.

In a further implementation form of the first, second and/or third aspects, a distribution of the plurality of time steps over time is selected randomly.

In an optional implementation form of the first, second and/or third aspects, the distribution of the plurality of time steps over time by applying an iterative process to identify an optimal time step size which minimizes the parity check syndrome for the recovered one or more codewords.

In an optional implementation form of the first, second and/or third aspects, grid search is applied to restrict a search space for selecting the distribution of the plurality of time steps over time.

In a further implementation form of the first, second and/or third aspects, the neural network based decoder is implemented using one or more transformer neural networks conditioned for the error correction code according to a number of parity errors detected in the one or more codewords. The transformer neural network is conditioned by employing a multi-dimension one hot decoding to a Hadamard product of an initial embedding created for the bits of the one or more codewords.

In a further implementation form of the first, second and/or third aspects, the one or more encoded codewords encode the zero codeword.

In a further implementation form of the fourth and/or fifth aspects, the mask is created based on an extended bipartite graph representation of the parity check matrix of the error correction code. The bipartite graph representation comprises a plurality of nodes connected via a plurality of edges. Each pair of connected bits comprises bits which share one or more nodes of the plurality of nodes and each pair of unconnected bits comprises bits which do not share any node of the plurality of nodes.

In a further implementation form of the fourth and/or fifth aspects, the bipartite graph is a Tanner graph.

In a further implementation form of the fourth and/or fifth aspects, each of the plurality of decoding layers further comprises a feed forward layer interleaved by a normalization layer from the self-attention layer.

In a further implementation form of the fourth and/or fifth aspects, the input layer is configured to create the embeddings for the received codeword, the embeddings have a higher dimension than the dimension of the received codeword.

In a further implementation form of the fourth and/or fifth aspects, the output layer is configured to reduce a dimension of a concatenated recovered codeword concatenating a plurality of recovered codewords computed by the plurality of decoding layers based on the embeddings.

In a further implementation form of the fourth and/or fifth aspects, the neural network based decoder employs a generic neural network free of any predefined modeling.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks automatically. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of methods and/or systems as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars are shown by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
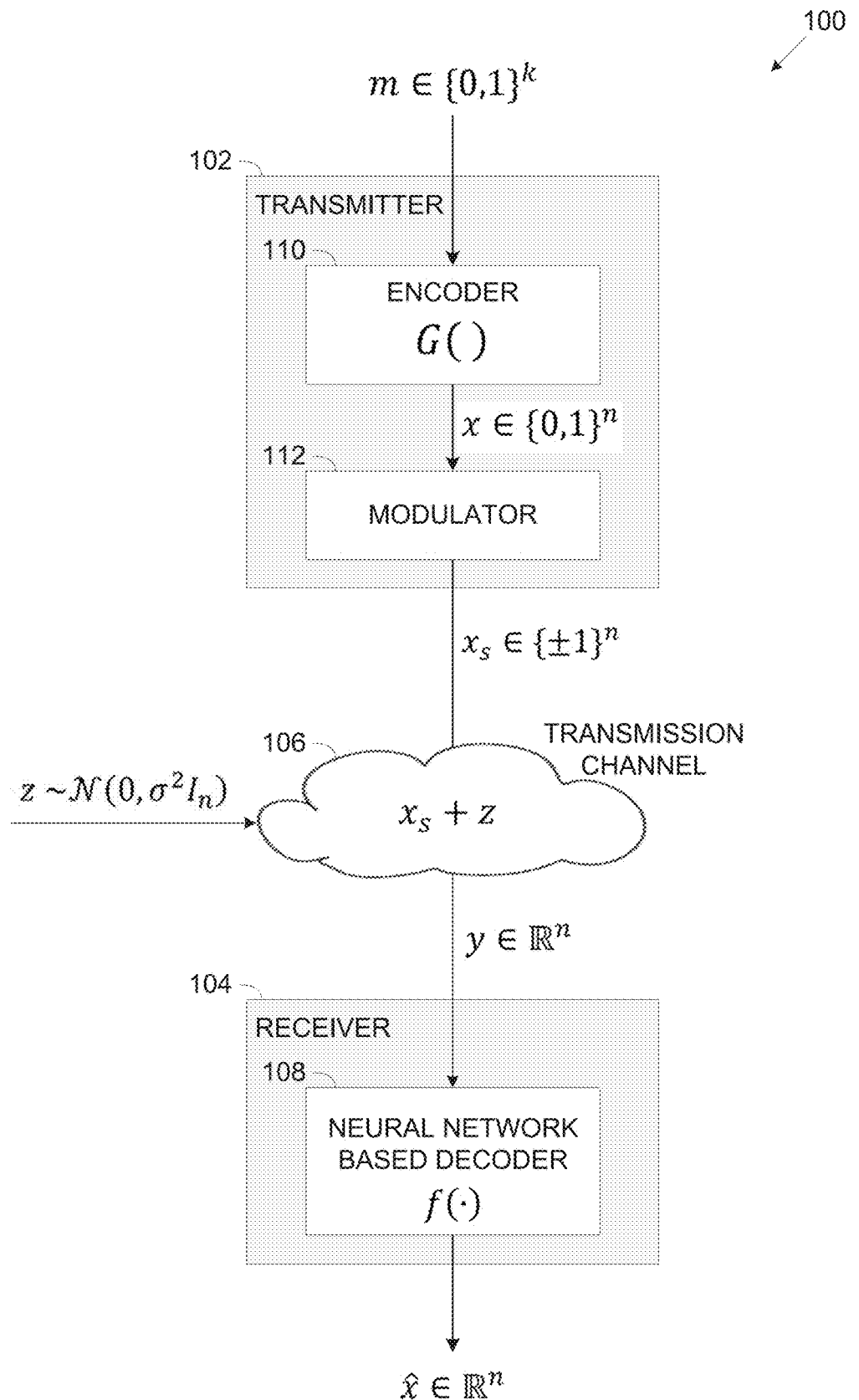
FIG. 1 is a schematic illustration of an exemplary transmission system comprising a neural network based decoder trained to decode error correction codes transmitted over a transmission channel, according to some embodiments of the present invention.

The present invention, in some embodiments thereof, relates to training and using neural networks to decode error correction codewords transmitted over transmission channels subject to interference, and, more specifically, training and using neural networks which employ reverse diffusion to decode error correction codewords transmitted over transmission channels subject to interference.

Wired and/or wireless transmission channels are basic building blocks for data transmission applications such as, for example, communication channels, network links, memory interfaces, components interconnections (e.g. bus, switched fabric, etc.) and/or the like. However, data transmitted via such transmission channels which are subject to one or more interferences such as, for example, noise, crosstalk, attenuation, and/or the like may often suffer errors induced by the interference.

Error correction codes may be therefore applied in the physical communication layer for encoding codewords transmitted via transmission channels to enable receiving decoders to efficiently detection and possibly correct errors in the transmitted encoded codewords in order to increase efficiency of the decoders to correctly recover the codewords while maintaining high transmission rates.

The ECC codes may include a wide range of error correction models and/or protocols as known in the art, for example, linear block codes such as, for example, algebraic linear code, polar code, Low Density Parity Check (LDPC) code, High Density Parity Check (HDPC) code and/or the like. However, the error correction codes may further include non-block codes such as, for example, convolutional codes and/or non-linear codes as well as non-linear codes such as, for example, Hadamard code and/or the like.

However, decoders used to decode the error correction codes may suffer degraded performance, for example, accuracy, reliability, consistency, and/or the like due to one or more limitations and/or features inherent to their construction.

For example, some commonly used efficient and robust decoders may employ model based neural networks based on one or more message passing algorithms, for example, Belief Propagation (BP), weighted Belief Propagation (WBP) and/or the like. Such neural networks may be constructed to reflect messages passed over nodes of a graph representation of the error correction code, for example, a bipartite graph such as, for example, tanner graph, factor graph and/or the like. However, the performance of such model based neural network decoders may be inherently limited by their underlying graph representation.

Other neural network decoders, for example, transformers may be based on model-free neural networks. These model-free neural network decoders may be also limited due to the lack of adaptation of the generic neural network to the error correction code used for encoding the transmitted codewords.

According to some embodiments of the present invention, there are provided methods and systems for constructing a novel neural network based decoder architecture for decoding error correction codes transmitted via transmission channels subject to interference using model-free networks which are specifically adapted (customized, conditioned) for the error correction codes.

In particular, the novel neural network based decoders may comprise one or more transformer neural networks, which are known in the art, having self-attention decoding layers specifically adapted for the error correction code used to encode the codewords. The conditioned transformer architecture of the present invention is therefore also designated Error Correction Code Transformer (ECCT) throughout this document.

The ECCT may be conditioned for the error correction code based on relations between bits in the code by adjusting the ECCT to consider only connected bits (related bits) while ignoring unrelated bits (unconnected bits). Conditioning the ECCT may be done by constructing a mask indicative of the relation between each bit of the code and each of the other bits. The mask which may be constructed based on the parity check matrix of the error correction code may be configured such that connected bits are unmasked and unconnected bits are masked.

The mask may be then applied to the self-attention decoding layers of the ECCT thus customizing and conditioning the ECCT for the error correction code.

Moreover, the ECCT is further configured to significantly increase the dimension of embedding created for the bits of the received encoded codewords (channel output) at the input layer(s) of the conditioned transformer neural network and reduce the dimension back down to its original dimension at the output layer. increasing the dimension of the bit embedding may improve the reorientation of the bits thus improving the representation of the relations between the bits of the error correction code which may significantly increase accuracy of the mask applied to condition the self-attention layers (module) of the ECCT.

As such, the ECCT relies on effective representation of the interactions between the bits of the error correction code and on the high-dimensional embedding of the channel output and the code-dependent masking scheme of the self-attention module.

The ECCT may present significant advantages and benefits compared to existing error correction code decoders including such decoders which employ neural network decoding.

First, due to a sparse design of the error correction codes for which the ECCT is conditioned, training and deployment of the ECCT may be highly more simple and affordable in terms of computing resources and/or time compared to the existing neural network decoders, both model-free and model based.

Moreover, as demonstrated herein after in detail, due to its conditioning to the error correction code the decoding performance of the ECCT is significantly improved compared to the existing neural network decoders including standard transformer based decoders which are not specifically adapted for the error correction codes.

Furthermore, the ECCT may outperform the existing decoders while consuming significantly less computing resources for the decoding task as well as for the training process, for example, processing resources, memory resources, processing time and/or the like. This in turn may also reduce costs of the ECCT which may further make it highly attractive and accepted for wide deployment in a plurality of applications According to some embodiments of the present invention, there are provided methods and systems for training and using neural network based decoder employing reverse diffusion to decode error correction codewords transmitted over transmission channels subject to interference.

Transmission of codewords encoded according to one or more of the error correction codes over the transmission channel which is subject to interference may be expressed as a diffusion process in which interference is gradually injected to the transmitted codewords over time.

One or more neural network based decoders may be therefore trained and configured to learn the pattern of the interference gradually injected to the transmitted codewords and execute a reverse diffusion process to estimate the originally transmitted codeword thus recovering it. Such trained neural network based decoder(s), which may be designated Diffusion Decoding Error Correction Code (DDECC) may typically comprise model-free neural networks which do not utilize and specific decoding model.

The reverse diffusion process may be specifically adapted and customized for ECC decoding by associating the levels of the interference gradually injected to the transmitted codewords with the parity check syndromes resulting from these interference levels.

To this end, the DDECC neural network based decoder(s) may be trained using a plurality of training samples associating one or more encoded codewords with two data items, (1) levels of interference gradually injected to the codeword (s) at a plurality of time steps distributed over time, and the parity check syndromes corresponding to the gradually increasing interference levels.

Optionally, since the DDECC neural network based decoder(s) are model-free which may be invariant to the transmitted codeword, the DDECC neural network based decoder(s) may be trained with a single codeword, optionally the zero codeword.

While the distribution of the plurality of time steps over time may be random and/or arbitrary, optionally the distribution may be optimized in order to increase decoding performance of the trained DDECC neural network based decoder(s). The distribution may be optimized by selecting a plurality of candidate time step sizes, evaluating the decoding performance of the DDECC neural network based decoder(s) for each of the candidates and selecting the optimal time step size yielding the best decoding performance.

The optimal time step size may be identified using one or more methods and/or techniques, for example, a line search, in particular a grid search which may restrict the search space for selecting the distribution of the plurality of time steps over time. The selected range and/or distribution of the time steps may impact the decoding performance of the DDECC neural network based decoder(s) since denser distributions may typically increase the performance compared to a more scattered distribution.

By its inherent nature, the reverse diffusion process may enable the DDECC neural network based decoder(s) to predict the multiplicative noise the codewords are subject to while transmitted via the transmission channel. The DDECC neural network based decoder(s) may be therefore further adapted to derive the additive noise from the multiplicative noise as known in the art and recover (estimate) the encoded codeword by removing the additive noise.

Applying the diffusion based denoising in neural networks trained and adapted for decoding error correction codes may present major advantages and benefit compared to existing decoding methods and systems.

First, as demonstrated by experiment results herein after, the DDECC neural network based decoder(s) may significantly outperform existing decoders whether traditional and/or neural decoders in its decoding performance. Not only that, but the DDECC neural network based decoder(s) may outperform the existing decoders while consuming significantly reduced computing resources (processing resources, memory resources, etc.) and/or computing time.

Moreover, applying the line and/or grid search to restrict the search space may further reduce the computing resources consumed for evaluating and identifying the optimal time step size.

Furthermore, since the selection of the time steps' sampling range and distribution may present a trade-off between training and/or inference computation resources utilization and/or computing time and decoding performance, the time steps range and/or distribution may be adapted according to the computation resources, speed and/or time available to the DDECC neural network based decoder(s) on one hand vs. the required decoding performance required and/or defined for the DDECC neural network based decoder(s).

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer program code comprising computer readable program instructions embodied on a computer readable medium may be transmitted using any appropriate medium, including but not limited to wireless, wire line, optical fiber cable, RF, etc., or any suitable combination of the foregoing.

The computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

The computer readable program instructions for carrying out operations of the present invention may be written in any combination of one or more programming languages, such as, for example, assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring now to the drawings, FIG. 1 is a schematic illustration of an exemplary transmission system comprising a neural network based decoder trained to decode error correction codes transmitted over a transmission channel, according to some embodiments of the present invention.

An exemplary transmission system 100 may include a transmitter 102 which may transmit data (messages) to a receiver 104 via a transmission channel 106 which may comprise one or more wired and/or wireless transmission channels deployed for one or more of a plurality of applications, for example, communication channels, network links, memory interfaces, components interconnections (e.g. bus, switched fabric, etc.) and/or the like.

In particular, the transmission channel 106 may be typically subject to one or more interferences, for example, noise, crosstalk, attenuation, and/or the like which may induce one or more errors into the transited data. Therefore, in order to overcome data corruption induced by the interference(s), the transmitter 102 transmitting the data according to one or more transmission and/or encoding algorithms and/or protocols may further comprise an encoder 110 configured to encode the transmitted data according to one or more error correction codes, models and/or protocols as known in the art to support error detection and/or correction.

The error correction codes, may include, for example, linear block codes such as, for example, algebraic linear code, polar code, LDPC code, HDPC code and/or the like. However, the error correction codes may further include non-block codes such as, for example, convolutional codes and/or the like and also non-linear codes such as, for example, Hadamard code and/or the like.

The transmitter 102 which is illustrated in FIG. 1 in general terms only may further include one or more additional circuits, modules and/or functions. For example, in case the of communication systems, the transmitter may include a modulator 112 configured to modulate the data encoded by the encoder 110 according to one or more modulation schemes as known in the art, for example, Binary Phase Shift Keying (BPSK), Quadrature Phase Shift Keying (QPSK), and/or the like.

The receiver 104 which is also illustrated in general terms only may comprise a decoder 108, in particular a neural network based decoder 108 comprising one or more trained neural networks as known in the art, for example, Deep Learning (DL) neural networks, such as for example, a transformer neural network, a FC neural network, a CNN, an FF neural network, an RNN and/or the like.

In a typical communication system, first, a length k binary message $m \in \{0,1\}^k$ may be encoded by the encoder 110 according to one or more error correction codes, for example, a linear code C. The encoder 110 may apply a generator matrix G of size k×n and a binary parity check matrix H of size (n−k)×n such that $GH^T = 0$ over the two elements' Galois field. The encoder 110 may therefore encode input data messages $m \in \{0,1\}^k$ into codewords $x = G^T m \in \{0,1\}^n$ of size k×n( ) where codeword $x \in C \subset \{0,1\}^n$ satisfies Hx=0.

The modulator 112 may then modulate the encoded codeword x according to one or more of the modulation schemes, for example, BPSK, i.e., over $\{\pm 1\}$.

While transmitted via the transmission channel 106 which is subject to one or more interferences the interference may be added to the encoded codeword x. For example, assuming a random noise z independent of the codeword x, for example, interference $z \sim N(0, \sigma_z^2 I_n)$ may be added to the encoded codeword x wherein $I_n$ is an identity matrix of size n with 1's in its main diagonal and 0's elsewhere.

The output of the transmission channel 106 which is received by the receiver 104 may be therefore denoted by $y \in \mathbb{R}^n$ represented by $y = x_s + z$, where $x_s$ denotes the modulation of the encoded codeword x, for example, BPSK.

The neural network based decoder 108 defined by f: $\mathbb{R}^n \to \mathbb{R}^n$ may be configured to estimate (e.g., soft approximation) $\hat{x} = f(y)$ of the codeword x where $\hat{x} \in \mathbb{R}^n$.

According to some embodiments of the present invention, the neural network based decoder 108 employs model-free transformer architecture, meaning that the neural network based decoder 108 does not rely on any decoding model such as, for example, Belief Propagation (BP), and/or the like.

The neural network based decoder 108 employing transformer architecture is noted transformer neural network based decoder 108A and Error Correction Code Transformer (ECCT) interchangeably herein after.

The transformer neural network based decoder 108A may be configured to apply pre-processing and post-processing as known in the art in order to ensure invariance to the transmitted codeword and/or to avoid overfitting, specifically increasing and reducing accordingly dimensions of the received codewords y.

This transformation of the channel output y may entail a loss of information without implying any intrinsic performance penalty in decoding, meaning that the preprocessing coupled with an appropriately designed transformer neural network based decoder 108A may achieve Minimum Mean Square Error (MMSE) decoding.

The preprocessing applied by the transformer neural network based decoder 108A may replace e received codewords y with a vector of dimensionality 2n–k as defined by equation 1 below.

$$\tilde{y} = h(y) = [|y|, s(y)] \quad \text{Equation 1:}$$

where, [·,·] denotes vector concatenation, |y| denotes the absolute value (magnitude) of y and $s(y) = Hy_b \in \{0,1\}^{n-k}$ denotes the binary code syndrome obtained via multiplication of the binary mapping y b of y by the parity check matrix H according to equation 2 below.

$$s(y) = Hy_b := \text{Hbin}(y) := H(0.5(\text{sign}(y)-1)) \quad \text{Equation 2:}$$

The post-processing applied by the transformer neural network based decoder 108A is directed to plug back the vector elements of y. As such the prediction of the codeword x may be expressed by equation 3 below.

$$\hat{x} = y \cdot f(h(y)) \quad \text{Equation 3:}$$

Moreover, the transformer neural network based decoder 108A may be parameterized with parameters $\theta$, $f_\theta$, such that the codeword $\hat{x}$ may be predicted according to equation 4 below.

$$\hat{x} = y \cdot f_\theta(|y|, Hy_b). \quad \text{Equation 4:}$$

The input sequence injected into transformer neural networks is first embedded into a high-dimensional space, coupled with positional embedding for each element. The embeddings are then propagated through multiple normalized self-attention and feed-forward blocks.

The self-attention mechanism introduced by the transformer neural networks is based on a trainable associative memory with (key, value) vector pairs, where a query vector $q \in R_d$ is matched against a set of k key vectors using scaled inner products, as expressed in equation 5 below.

$$A(Q, K, V) = \text{Softmax}\left(\frac{QK^T}{\sqrt{d}}\right)V \quad \text{Equation 5}$$

where $Q \in R^{N \times d}$, $K \in R^{k \times d}$ and $V \in R^{k \times d}$ represent the packed N queries, k keys and v values tensors respectively. Keys, queries and values are obtained using linear transformations of the sequence's elements. A multi-head self-attention layer is defined by extending the self-attention mechanism using h attention heads, i.e. h self-attention functions applied to the input, re-projected to values via a dh×D linear layer.

Figure 2:
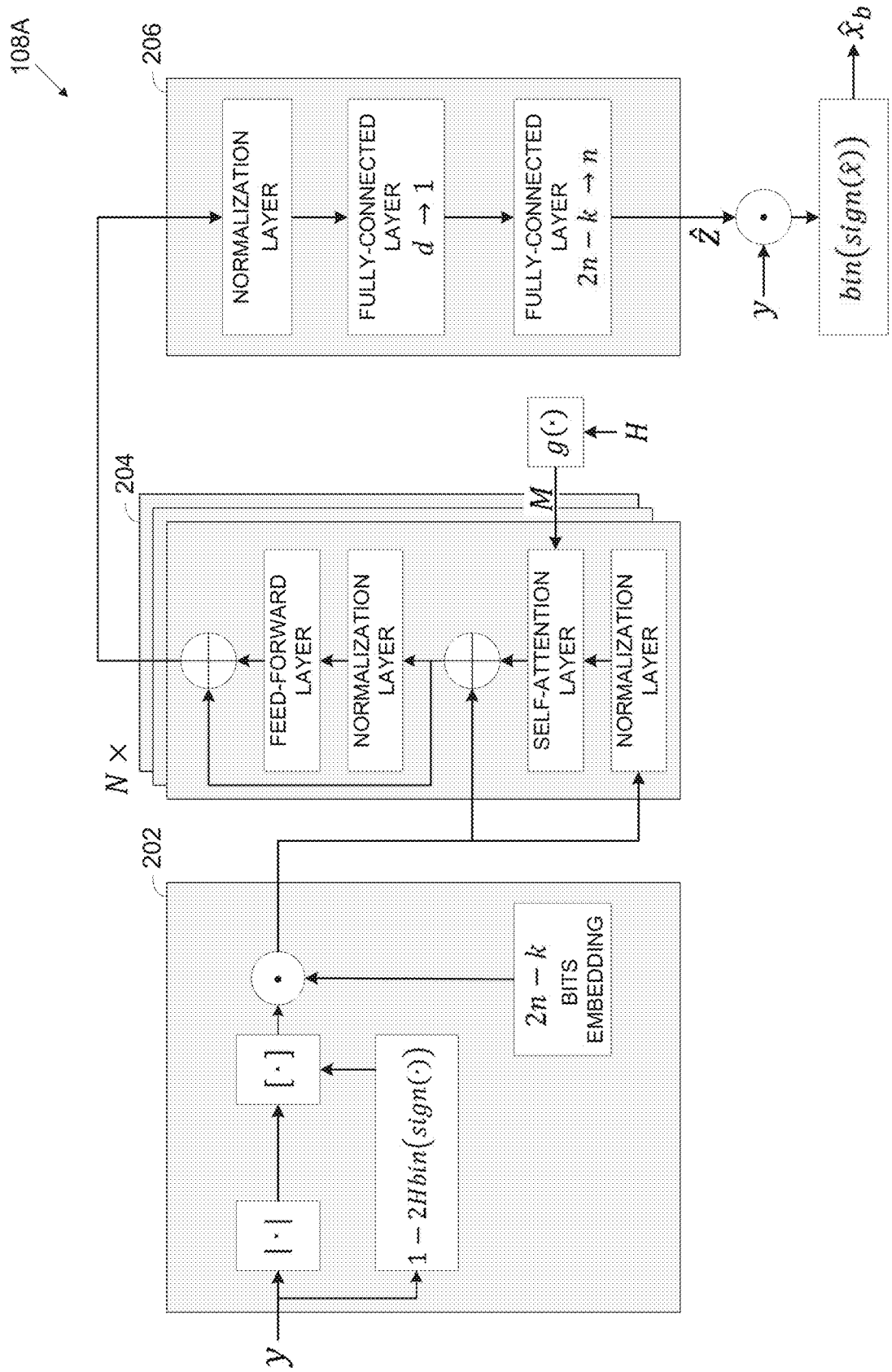
FIG. 2 is a schematic illustration of an exemplary transformer neural network based decoder trained to decode error correction code transmitted over a transmission channel, according to some embodiments of the present invention.

Reference is now made to FIG. 2, which is a schematic illustration of an exemplary transformer neural network based decoder trained to decode error correction code transmitted over a transmission channel, according to some embodiments of the present invention.

A transformer neural network based decoder such as the transformer neural network based decoder 108A may be constructed of an input layer 202, a plurality (N) of decoding layers 204 and an output layer 206.

The input layer 202 may be configured for creating embeddings $\phi_i$ for a plurality of bits of the received codeword y encoded using an error correction code and transmitted over the transmission channel 106 subject to interference z. In particular, the embeddings created by the input layer 202 for the received codeword y may have a higher dimension than the dimension of the received codeword y.

The transformer neural network based decoder 108A may employ positional reliability encoding in which each dimension of $\{\tilde{y}_1\}_{i=1}^{2n-k}$ is considered separately and projected to a high d dimensional embedding $\{\phi_i\}_{i=1}^{2n-k}$ according to equation 6 below.

$$\phi_i = \begin{cases} |y_i|, W_i, & i \leq n \\ (1 - 2(s(y))_{i-n+1}), & \text{otherwise} \end{cases} \quad \text{Equation 6}$$

where $\{W_j \in R^d\}_{j=1}^{2n-k}$ denotes one-hot encoding defined according to the bit position.

The embedding $\phi_i$ is modulated by the magnitude and syndrome values, such that less reliable elements (i.e. low magnitude) collapse to the origin. This propriety may be highly beneficial when applied to the standard dot product of the self-attention module.

Applying the modulating for the first layer 202 and each two distinct information bits embedding $\phi_i$, $\phi_j$ may be expressed by equation 7 below.

$$\langle \phi_i, \phi_j \rangle = \begin{cases} |y_i||y_j|, \langle W_i, W_j \rangle, & i, j \leq n \\ |y_i|(1 - 2(s(y))_{j-n+1})\langle W_i, W_j \rangle, & i \leq n < j \end{cases} \quad \text{Equation 7}$$

As evident, an unreliable information bit vanishes and a non-zero syndrome entails a negative scaling, potentially reducing the impact on the softmax aggregation.

In contrast to model based neural network decoders known in the art, which may require permutation of the code in order to artificially provide indications to the fully connected network about the most reliable channel outputs, the transformer neural network based decoder 108A may directly obtain and maintain the channel output reliability via the scaled bit-wise embedding. The proposed scaled encoding can be thought of as a positional encoding according to the input reliability since the bit positions are fixed. Representing the codeword by a set of one-hot vectors as done by the transformer neural network based decoder 108A is very different neural network decoders known in the art.

Each of the N decoding layers 204 may comprise a self-attention layer comprising one or more heads.

In order to detect and correct errors, decoders in general may analyze and compare the received codeword bits via the parity check equations, such that a non-zero syndrome indicates that channel errors have occurred. In the transformer neural network based decoder 108A bit comparisons may become natural via its self-attention interaction mechanism implemented in the decoding layers 204.

However, comparing every pair of (embedding) elements, as may be generally performed in transformer architectures, may be sub-optimal, since not every bit is necessarily related to all other bits.

The self-attention mechanism of the and the transformer neural network based decoder 108A may be therefore adjusted to incorporate fundamental domain knowledge about the relevant code. Specifically, the self-attention mechanism, i.e., layers 204 may be adjusted and/or configured to indicate that the syndrome values should only be dependent on the corresponding parity check bits.

This may be achieved by constructing the self-attention head(s) of each self-attention layer 204 according to a mask indicative of a relation between embeddings corresponding to bits of the received encoded codeword y.

This mask may be defined for each given error correction code based in the respective parity matrix H and applied to the self-attention modules, i.e., decoding layers 204 of the transformer neural network based decoder 108A. The mask expressed by a function g (H): $\{0,1\}^{(n-k) \times k} \rightarrow \{-\infty, 0\}^{2n-k \times 2n-k}$ may be applied to construct the self-attention heads according to equation 8 below.

$$A_H(Q, K, V) = \text{Softmax}\left(\frac{QK^T + g(H)}{\sqrt{d}}\right)V \quad \text{Equation 8}$$

The constructed mask may be symmetric such that it may contain information about every pairwise bit relation between bits of the error correction code. Specifically, the mask may express relations between embeddings corresponding to each bit of the code and the embeddings corresponding to each of the other bits of the code.

An exemplary mask construction algorithm described in pseudo-code excerpt 1 below may be applied to construct the mask applied to the self-attention decoding layers 204 of the transformer neural network based decoder 108A for a given error correction code.

| Pseudo-Code Excerpt 1: Mask construction algorithm |
|---|
| Function g(H) |
| 1    I, n = H.shape |
| 2    k = n - I |
| 3    mask = eye(2n - k) |
| 4    for i in range(0, n - k) do |
| 5        idx = where(H[i] == 1) |
| 6        for j in idx do |
| 7            mask [n + i, j] = mask [j, n + 1] = 1 |
| 8            for k in idx do |
| 9                mask[j, k] = mask [k, j] = 1 |
| 10           end |
| 11       end |
| 12   end |
| 13   return −∞(¬ mask) |

As seen, the mask may be first initialized as the identity matrix. For each row i of the binary parity check matrix H, the locations of every pair of ones in the row are unmasked in the mask since those bits are connected and may impact each other as well as the syndrome in the decoding procedure. The location of pairs of ones with the corresponding syndrome bit at n+1 are also unmasked in the mask, since these locations define the parity check equations.

As such, the mask created based on the parity check matrix of the given error correction code may be adapted to unmask pairs of connected bits which are related to each other while mask pairs of unconnected bits which do not impact each other.

Figure 3:
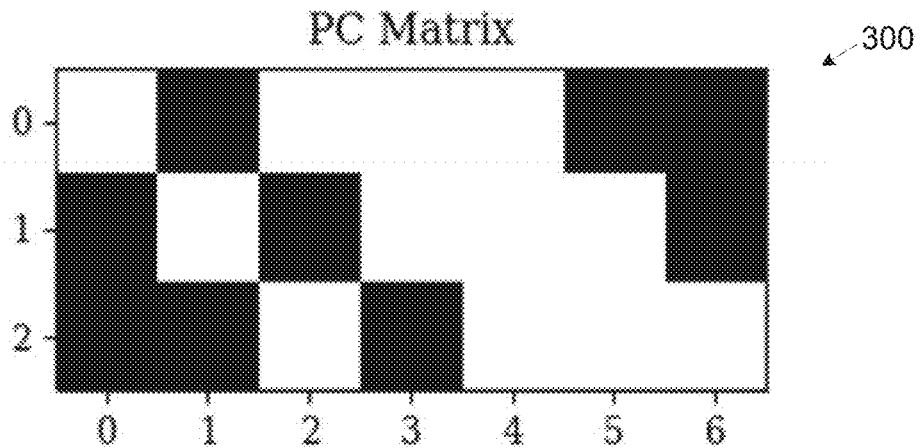
FIG. 3 presents schematic illustrations of an exemplary mask computed for a transformer neural network based decoder based on a graphical representation of an error correction code, according to some embodiments of the present invention.
Figure 3:
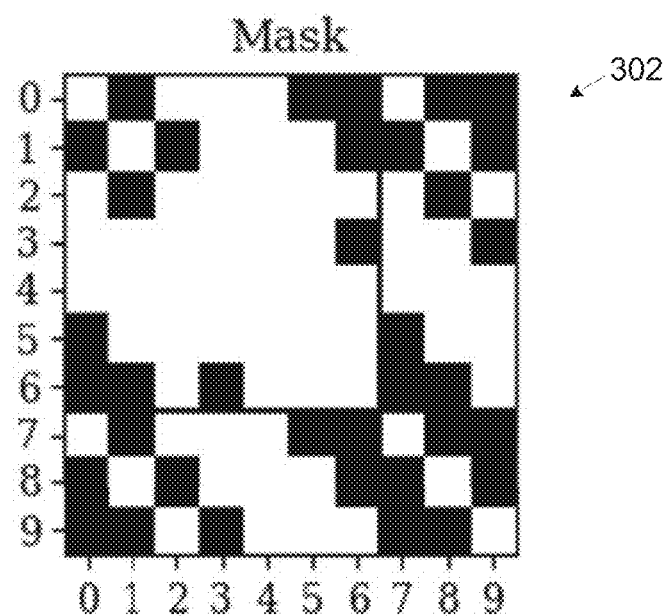
Figure 3:
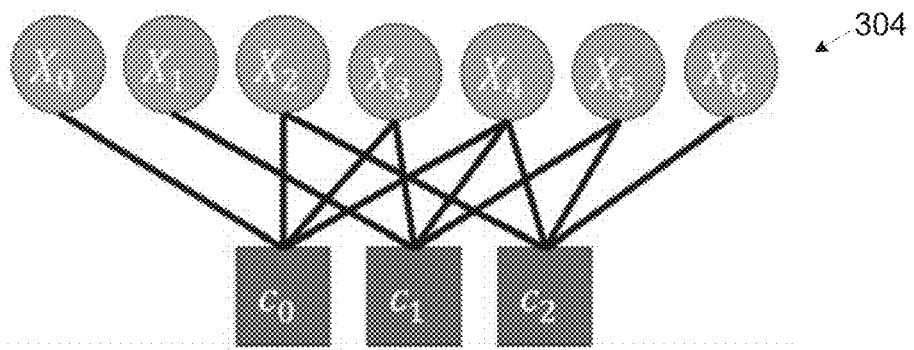

Reference is now made to FIG. 3, which presents schematic illustrations of an exemplary mask computed for a transformer neural network based decoder based on a graphical representation of an error correction code, according to some embodiments of the present invention.

An exemplary mask 302 may be constructed based on a parity check matrix 300 of a certain error correction code, for example, a Hamming(7,4). In particular, the mask 302 may be constructed based on a bipartite graph reprehension, for example, a Tanner graph partially illustrated in 304 of the parity check matrix 300 which is extended to a two rings connectivity.

As such, the plurality of N decoding layers 204 may be trained to decode the received encoded codeword y by predicting the interference z based on the relation between connected bits while ignoring the unconnected bits.

The mask construction and use in the self-attention layers 204 may enable greater freedom in decoding the encoded codeword y compared to the relations enabled by the Tanner graph as may be done by standard transformer decoders since related bits may impact each other beyond the parity check equations. While standard (regular) transformers may be assimilated to neural networks applied on a complete bipartite graph, the mask applied in the self-attention layers 204 of the transformer neural network based decoder 108A may be seen as the adjacency matrix of the bipartite graph extended to a two rings connectivity. Moreover, in contrast to BP based neural network decoders, which may collapse the information via interleaved variable and check layers, the masked self-attention employed by the transformer neural network based decoder 108A may allow simultaneous cross-analysis of related elements (embedding s).

Moreover, since the mask is fixed and computed only once during training, the self-attention quadratic complexity bottleneck $O(n^2d)$ may be reduced to the density of the error correction code $O(P_{ij}(H)_{ij}d)$. This property may be of particular appeal for low-density codes but also showed significant complexity reduction of up to 84% for other codes as demonstrated by experiments presented herein after.

As seen in FIG. 2, the initial encoding of the received codeword y may be defined in the input layer 202 of the transformer neural network based decoder 108A as a d dimensional one hot encoding of the 2n−k input elements.

The transformer neural network based decoder 108A may be defined by a concatenation of the N decoding layers 204 each composed of self-attention and feed-forward layers interleaved by normalization layers. Each self-attention layer may include multiple heads, for example, eight.

The output layer 206 of the transformer neural network based decoder 108A may be configured to reduce the dimension of the concatenated recovered codeword concatenating the plurality of recovered codewords computed by the N decoding layers 204 based on the embeddings.

The output layer 206 may employ one or more architectures for reducing the dimensions of the concatenated codeword. For example, the output layer 206 may be defined by one or more layers, for example, two Fully Connected (FC) layers. The first FC layer may reduce the element-wise embedding to a one-dimensional 2n−k vector and the second FC layer may further reduce it to a n dimensional vector representing the soft decoded interference (noise) z.

The dimension of the feed-forward network of each decoding layer 204 may be, for example, four times that of the embedding and may be composed Gaussian Error Linear Unit (GELU) layers with layer normalization set to the pre-layer norm setting as known in the art.

The transformer neural network based decoder 108A may be trained in one or more training session to decode received encoded codewords y by predicting the interference z. The training objective may be therefore a cross-entropy function applied such that the transformer neural network based decoder 108A learns to predict the multiplicative noise $\tilde{z}$ as known in the art. The soft multiplicative interference (noise) may be denoted $\tilde{z}_s$ such that $y = x_s \tilde{z}_s$, which derives $\tilde{z}_s = \tilde{z} x_s^2 = y x_s$.

The binary multiplicative interference to be predicted may be therefore defined by $\tilde{z}_s=\text{bin}(y \cdot x_s)$, such that the loss computed for a single received codeword y may be expressed by equation 9 below.

$$\mathcal{L} = -\sum_{i=1}^{n} \tilde{z}_i \log(f_\theta(y)) + (1-\tilde{z}_i)\log(1-f_\theta(y)) \quad \text{Equation 9}$$

The estimated binary (hard-decoded) codeword $\hat{x}_b$ can be straightforwardly obtained as $\hat{x}_b=\text{bin}(\text{sign}(f_\theta(y) \cdot y))$.

Figure 4:
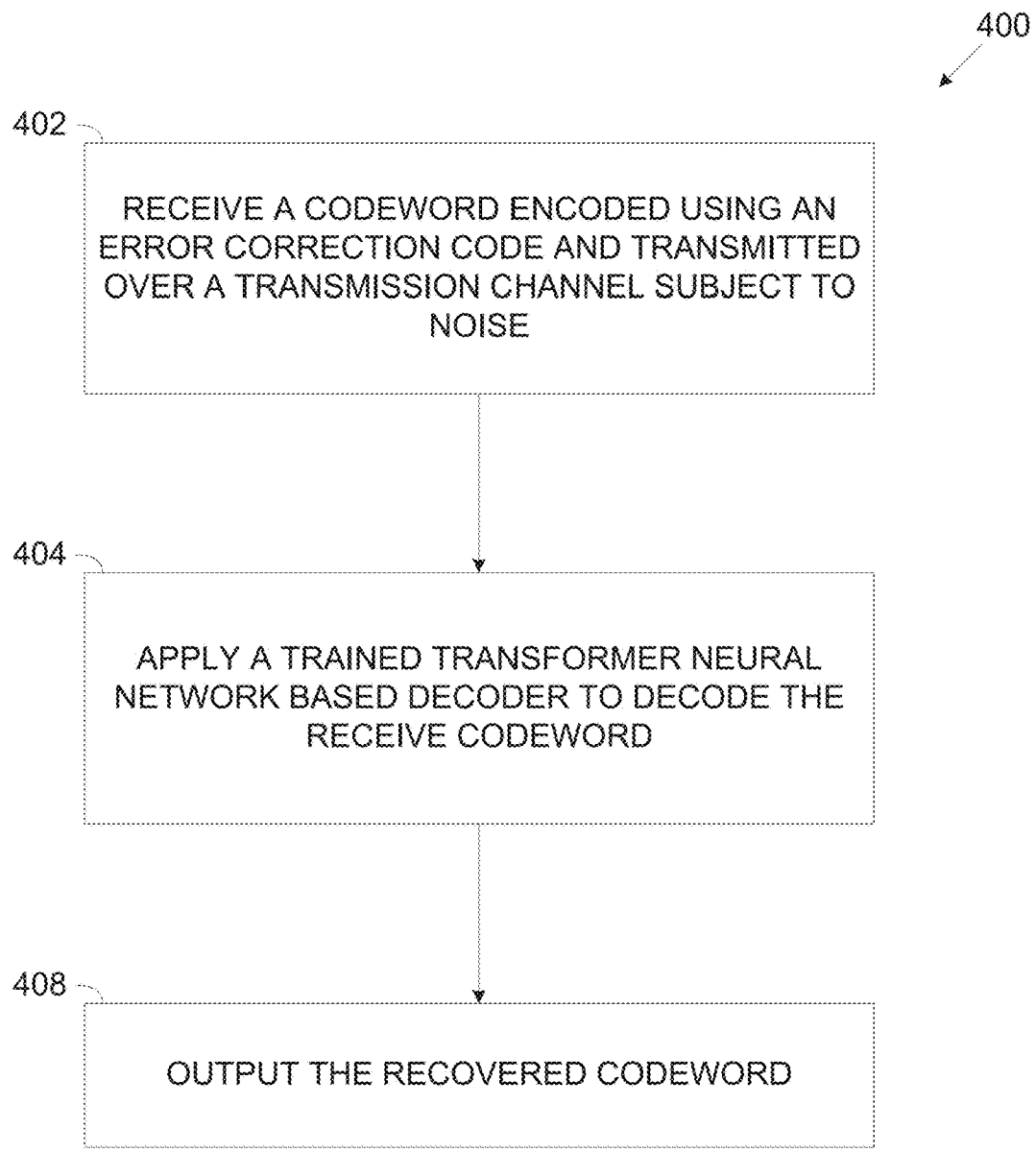
FIG. 4 is a flowchart of an exemplary process of using a trained transformer neural network based decoder to decode error correction codes, according to some embodiments of the present invention.

Reference is now made to FIG. 4, which is a flowchart of an exemplary process of using a trained transformer neural network based decoder to decode error correction codes, according to some embodiments of the present invention.

As exemplary process 400 may be executed by a receiver such as the receiver 104 to decode one or more codewords such as the codeword x encoded according to one or more error correction codes which are transmitted by a transmitter such as the transmitter 102 via a transmission channel such as the transmission channel 106 subject to interference z.

As shown at 402, the receiver 104 may receive a respective encoded codeword represented by y=x+z.

As shown at 404, the receiver 104 may apply a transformer neural network based decoder such as the transformer neural network based decoder 108A to decode the received encoded codeword y. In particular, the transformer neural network based decoder 108A may be trained to predict the interference z as described herein before and recover the codeword $\hat{x}$ by removing the predicted interference z.

As shown at 406, the receiver 104 may output the recovered (decoded) codeword $\hat{x}$.

Presented herein are experiments conducted to evaluate and demonstrate the performance of the transformer neural network based decoder 108A.

An exemplary transformer neural network based decoder 108A comprising 10 decoding layers 204 (N=10) was trained using 128 samples per mini-batch for 1500 epochs. It should be noted that while training the transformer neural network based decoder 108A using more epochs may further improve its performance, training the transformer neural network based decoder 108A with 1500 epochs was sufficient to outperform existing state of the art decoders.

Since the construction and architecture of the transformer neural network based decoder 108A is independent of the decoded codeword, the zero codeword may be enough for training the transformer neural network based decoder 108A.

The interference, for example, additive Gaussian noise is sampled randomly per batch in the {3, . . . , 7} normalized Signal to Noise Ratio (SNR) (i.e. $E_b/N_O$) range. The learning rate was initialized to $10^{-4}$ coupled with a cosine decay scheduler down to $10^{-7}$ at the end of the training. No warmup was employed as known in the art. Training time range was from 12 to 24 hours depending on the error correction code length, and no optimization of the self-attention mechanism was employed.

Training and experiments were performed on a 12 GB Titan V GPU. The training time was in the range of 19-40, 40-102, and 56-171 seconds per epoch for N=2,6,10 architectures of the transformer neural network based decoder 108A, respectively.

The transformer neural network based decoder 108A was evaluated for decoding three classes of linear block error correction codes, LDPC codes, Polar codes, and Bose-Chaudhuri-Hocquenghem (BCH) codes. Parity check matrices as known in the art are used for these codes. As described herein before, the architecture of the transformer neural network based decoder 108A is defined solely by the number N of encoding layers 204 and the dimension d of the embedding.

Performance of the transformer neural network based decoder 108A (ECCT) was compared to several existing state of the art decoders, including BP algorithm (designated BP), augmented hyper-graph network BP algorithm (designated Hyper BP), syndrome-based deep RNN architecture (designated RNN), and autoregressive BP (designated AR BP).

The results of the experiments are reported in table 1 below in terms of the negative natural logarithm of the Bit Error Rate (BER) for different normalized SNR values (dB). During testing, the decoders are applied to decode at least $10^5$ random codewords in order to obtain at least 500 frames with errors at each SNR value.

TABLE 1

| | Algorithm | | | | | | | | |
|---|---|---|---|---|---|---|---|---|---|
| | BP | | | Hyper BP | | | AR BP | | |
| Code | 4 | 5 | 6 | 4 | 5 | 6 | 4 | 5 | 6 |
| Polar (64, 32) | 3.52 4.26 | 4.04 5.38 | 4.48 6.50 | 4.25 4.59 | 5.49 6.10 | 7.02 7.69 | 4.77 5.57 | 6.30 7.43 | 8.19 9.82 |
| Polar (64, 43) | 4.15 4.74 | 4.68 5.94 | 5.31 7.42 | 4.91 4.92 | 6.48 6.44 | 8.41 8.39 | 5.25 5.41 | 6.96 7.19 | 9.00 9.30 |
| Polar (128, 64) | 3.38 4.10 | 3.80 5.11 | 4.15 6.15 | 3.89 4.52 | 5.18 6.12 | 6.94 8.25 | 4.02 4.84 | 5.48 6.78 | 7.55 9.30 |
| Polar (128, 86) | 3.80 4.49 | 4.19 5.64 | 4.62 6.97 | 4.57 4.95 | 6.18 6.84 | 8.27 9.28 | 4.81 5.39 | 6.57 7.37 | 9.04 10.13 |
| Polar (128, 96) | 3.99 4.61 | 4.41 5.79 | 4.78 7.08 | 4.73 4.94 | 6.39 6.76 | 8.57 9.09 | 4.92 5.27 | 6.73 7.44 | 9.30 10.20 |
| LDPC (49, 24) | 5.30 6.23 | 7.28 8.19 | 9.88 11.72 | 5.76 6.23 | 7.90 8.54 | 11.17 11.95 | 6.05 6.58 | 8.13 9.39 | 11.68 12.39 |

TABLE 1-continued

| Code | | | | | | | | | |
|---|---|---|---|---|---|---|---|---|---|
| LDPC (121, 60) | 4.82 | 7.21 | 10.87 | 5.22 | 8.29 | 13.00 | 5.22 | 8.31 | 13.07 |
| | — | — | — | — | — | — | — | — | — |
| | — | — | — | — | — | — | — | — | — |
| LDPC (121, 70) | 5.88 | 8.76 | 13.04 | 6.39 | 9.81 | 14.04 | 6.45 | 10.01 | 14.77 |
| | — | — | — | — | — | — | — | — | — |
| | — | — | — | — | — | — | — | — | — |
| LDPC (121, 80) | 6.66 | 9.82 | 13.98 | 6.95 | 10.68 | 15.80 | 7.22 | 11.03 | 15.90 |
| | — | — | — | — | — | — | — | — | — |
| | — | — | — | — | — | — | — | — | — |
| MacKey (96, 48) | 6.94 | 9.40 | 12.57 | 7.19 | 10.02 | 13.16 | 7.43 | 10.65 | 14.65 |
| | — | — | — | — | — | — | — | — | — |
| | — | — | — | — | — | — | — | — | — |
| CCSDS (128, 64) | 6.55 | 9.65 | 13.78 | 6.99 | 10.57 | 15.27 | 7.25 | 10.99 | 16.36 |
| | — | — | — | — | — | — | — | — | — |
| | — | — | — | — | — | — | — | — | — |
| BCH (31, 16) | 4.63 | 5.88 | 7.60 | 5.05 | 6.64 | 8.80 | 5.48 | 7.37 | 9.61 |
| | — | — | — | — | — | — | — | — | — |
| | — | — | — | — | — | — | — | — | — |
| BCH (63, 36) | 3.72 | 4.65 | 5.66 | 3.96 | 5.35 | 7.20 | 4.33 | 5.94 | 8.21 |
| | 4.03 | 5.42 | 7.26 | 4.29 | 5.91 | 8.01 | 4.57 | 6.39 | 8.92 |
| | — | — | — | — | — | — | — | — | — |
| BCH (63, 45) | 4.08 | 4.96 | 6.07 | 4.48 | 6.07 | 8.45 | 4.80 | 6.43 | 8.69 |
| | 4.36 | 5.55 | 7.26 | 4.64 | 6.27 | 8.51 | 4.97 | 6.90 | 9.41 |
| | — | — | — | — | — | — | — | — | — |
| BCH (63, 51) | 4.34 | 5.29 | 6.35 | 4.64 | 6.08 | 8.16 | 4.95 | 6.69 | 9.18 |
| | 4.50 | 5.82 | 7.42 | 4.80 | 6.44 | 8.58 | 5.17 | 7.16 | 9.53 |
| | — | — | — | — | — | — | — | — | — |

| | ECCT (N = 2) | | | ECCT (N = 6) | | | ECCT (N = 10) | | |
|---|---|---|---|---|---|---|---|---|---|
| Code | 4 | 5 | 6 | 4 | 5 | 6 | 4 | 5 | 6 |
| Polar (64, 32) | 4.27 | 5.44 | 6.95 | 5.71 | 7.63 | 9.94 | — | — | — |
| | 4.57 | 5.86 | 7.50 | 6.48 | 8.60 | 11.43 | | | |
| | 4.87 | 6.20 | 7.93 | 6.99 | 9.44 | 12.32 | | | |
| Polar (64, 43) | 4.92 | 6.46 | 8.41 | 5.82 | 7.81 | 10.24 | — | — | — |
| | 5.14 | 6.78 | 8.90 | 6.15 | 8.20 | 10.86 | | | |
| | 5.36 | 7.12 | 9.39 | 6.36 | 8.46 | 11.09 | | | |
| Polar (128, 64) | 3.51 | 4.52 | 5.93 | 4.47 | 6.34 | 8.89 | — | — | — |
| | 3.83 | 5.16 | 7.04 | 5.12 | 7.36 | 10.48 | | | |
| | 4.04 | 5.52 | 7.62 | 5.92 | 8.64 | 12.18 | | | |
| Polar (128, 86) | 4.30 | 5.58 | 7.34 | 5.36 | 7.45 | 10.22 | — | — | — |
| | 4.49 | 5.90 | 7.75 | 5.75 | 8.16 | 11.29 | | | |
| | 4.75 | 6.25 | 8.29 | 6.31 | 9.01 | 12.45 | | | |
| Polar (128, 96) | 4.56 | 5.98 | 7.93 | 5.39 | 7.62 | 10.45 | — | — | — |
| | 4.69 | 6.20 | 8.30 | 5.88 | 8.33 | 11.49 | | | |
| | 4.88 | 6.58 | 8.93 | 6.31 | 9.12 | 12.47 | | | |
| LDPC (49, 24) | 4.33 | 5.79 | 7.69 | 5.45 | 7.65 | 10.58 | 6.35 | 9.01 | 12.43 |
| | 4.40 | 5.89 | 7.99 | 5.60 | 7.93 | 11.13 | | | |
| | 4.53 | 6.10 | 8.33 | 5.79 | 8.71 | 12.10 | | | |
| LDPC (121, 60) | 3.80 | 5.32 | 7.79 | 4.77 | 7.52 | 11.99 | 5.51 | 8.89 | 14.51 |
| | 3.81 | 5.36 | 7.87 | 4.88 | 7.77 | 12.39 | | | |
| | 3.80 | 5.45 | 8.06 | 5.01 | 7.99 | 12.78 | | | |
| LDPC (121, 70) | 4.49 | 6.38 | 9.24 | 5.80 | 9.11 | 13.77 | 6.86 | 11.02 | 16.85 |
| | 4.52 | 6.44 | 9.36 | 6.04 | 9.54 | 14.65 | | | |
| | 4.53 | 6.49 | 9.39 | 6.19 | 9.89 | 15.58 | | | |
| LDPC (121, 80) | 5.11 | 7.18 | 10.18 | 6.63 | 10.28 | 15.10 | 7.76 | 12.30 | 17.82 |
| | 5.13 | 7.26 | 10.28 | 6.84 | 10.56 | 15.68 | | | |
| | 5.24 | 7.46 | 10.66 | 7.07 | 10.96 | 16.25 | | | |
| MacKey (96, 48) | 4.92 | 6.62 | 8.88 | 6.78 | 9.61 | 13.31 | 8.39 | 12.24 | 16.41 |
| | 4.98 | 6.72 | 9.04 | 7.02 | 10.12 | 14.18 | | | |
| | 5.12 | 6.98 | 9.44 | 7.23 | 10.42 | 14.12 | | | |
| CCSDS (128, 64) | 4.27 | 5.97 | 8.18 | 6.29 | 9.59 | 13.95 | 8.02 | 12.60 | 17.75 |
| | 4.39 | 6.03 | 8.43 | 6.49 | 10.18 | 14.76 | | | |
| | 4.47 | 6.22 | 8.74 | 6.77 | 10.55 | 15.90 | | | |
| BCH (31, 16) | 4.51 | 5.74 | 7.35 | 5.74 | 7.42 | 9.59 | 8.02 | 12.60 | 17.75 |
| | 4.78 | 6.15 | 7.98 | 5.85 | 7.52 | 10.08 | | | |
| | 5.18 | 6.82 | 87.91 | 6.39 | 8.29 | 10.66 | | | |
| BCH (63, 36) | 3.79 | 4.87 | 6.35 | 4.42 | 5.91 | 8.01 | | | |
| | 4.05 | 5.28 | 7.01 | 4.62 | 6.24 | 8.44 | | | |
| | 4.21 | 5.50 | 7.25 | 4.86 | 6.65 | 9.10 | | | |
| BCH (63, 45) | 4.47 | 5.88 | 7.81 | 5.16 | 7.02 | 9.75 | | | |
| | 4.66 | 6.16 | 8.17 | 5.41 | 7.49 | 10.25 | | | |
| | 4.79 | 6.39 | 8.49 | 5.60 | 7.79 | 10.93 | | | |
| BCH (63, 51) | 4.60 | 6.05 | 8.05 | 5.20 | 7.08 | 9.65 | | | |
| | 4.78 | 6.34 | 8.49 | 5.46 | 7.57 | 10.51 | | | |
| | 5.01 | 6.72 | 9.03 | 5.66 | 7.89 | 11.01 | | | |

Table 1 lists the results achieved for each of the error correction codes by the BP based algorithms (BP, Hyper BP and AR BP) for 5 and 50 iterations in the first and second rows of each code, corresponding to a neural network with 10 and 100 layers, respectively. Results of the transformer neural network based decoder 108A (ECCT) are presented for six different architectures with N={2,6}, d={32,64,128} respectively listed in the first, second and third rows of each code. Since, as known in the art, LDPC codes may be optimized for BP decoding, decoding performance results of the LDPC codes are presented also for N=10, d=128 architecture of the ECCT. The columns designated Columns 4, 5, 6 correspond to normalized SNR values $E_b/N_o$={4, 5, 6}.

As may be seen in table 1, the ECCT outperforms all the existing BP based decoders by significantly large margins on several codes, at only a fraction of the number of iterations. Evidently, the ECCT is also able to outperform legacy methods (e.g. BP) at convergence, even with extremely shallow architectures (e.g., N=2, d=32). It should be noted that as reflected by the results in table 1, the ECCT may perform better for high rate (i.e. k/n) error correction codes.

Concurrent results are obtained after L=5 BP iterations (corresponding to 10 layers neural network) are presented in the first row of each code and at convergence results obtained after L=50 BP iterations (i.e. 100 layers neural network) are presented in the second row of each code. Best results in bold, second best is underlined, and the minimal ECCT to outperform every other competing method is in italic.

Figure 5A:
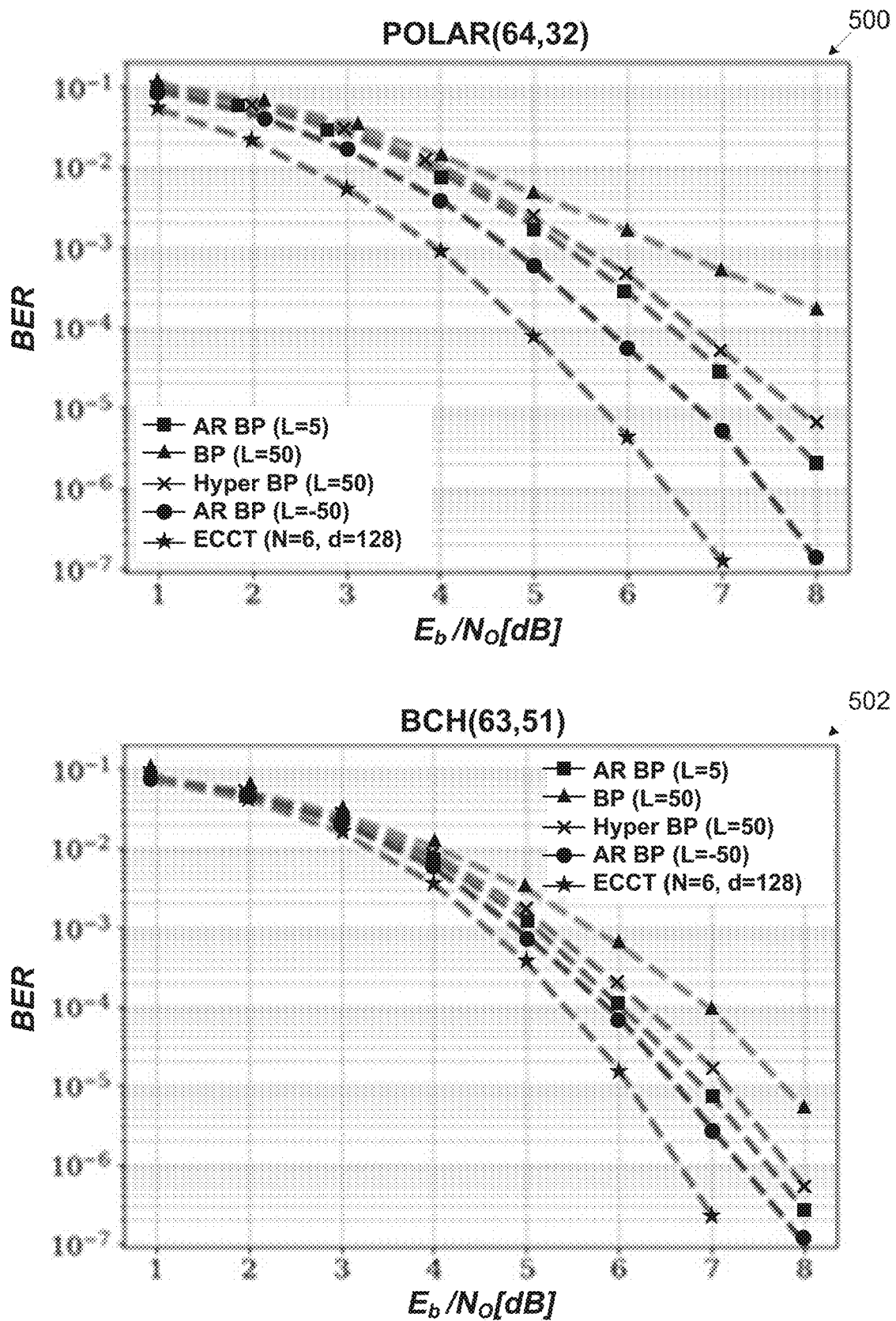
FIG. 5A and FIG. 5B are graph charts comparing BER vs. SNR for several neural network based decoders applied to decode several error correction codes, according to some embodiments of the present invention.
Figure 5B:
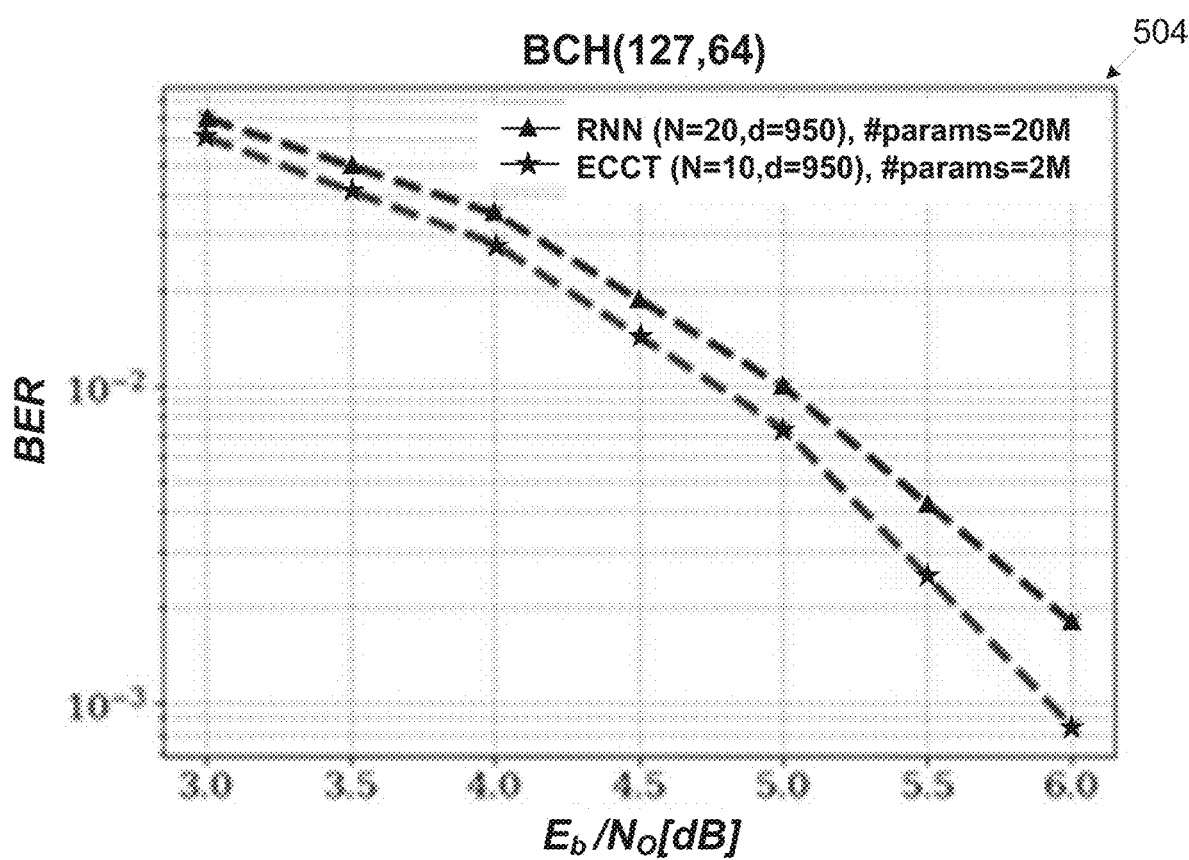

Reference is also made to FIG. 5A and FIG. 5B, which are graph charts comparing BER vs. SNR for several neural network based decoders applied to decode several error correction codes, according to some embodiments of the present invention.

Graph charts 500 and 502 present BER results for the BP based decoders and the ECCT decoding POLAR(64,32) and BCH(63,51) codes respectively. As evident from the graph charts 500 and 502, the ECCT outperforms the converged AR BP model by up to two orders of magnitude for high SNR values.

Graph chart 504 shows a comparison between the ECCT and the syndrome-based deep RNN architecture (RNN) for a BCH(127,64) code. The RNN network is built as a five-layer stacked Gated Recurrent Units (GRU) model, with five iterations with an embedding of 5(2n−k)=950 trained for 5000 epochs, with a batch size of 1000. As can be seen, the ECCT outperforms this RNN model by up to 211%, with only half the number of layers, one-tenth as many parameters, and a fraction of the training requirements in terms of batch size and number of epochs.

Analysis was conducted to evaluate the impact of the embedding and the masking procedure applied in the design of the transformer neural network based decoder 108A (ECCT). Moreover, complexity of the transformer neural network based decoder 108A is also analyzed compared to the existing neural network based decoders.

Figure 6:
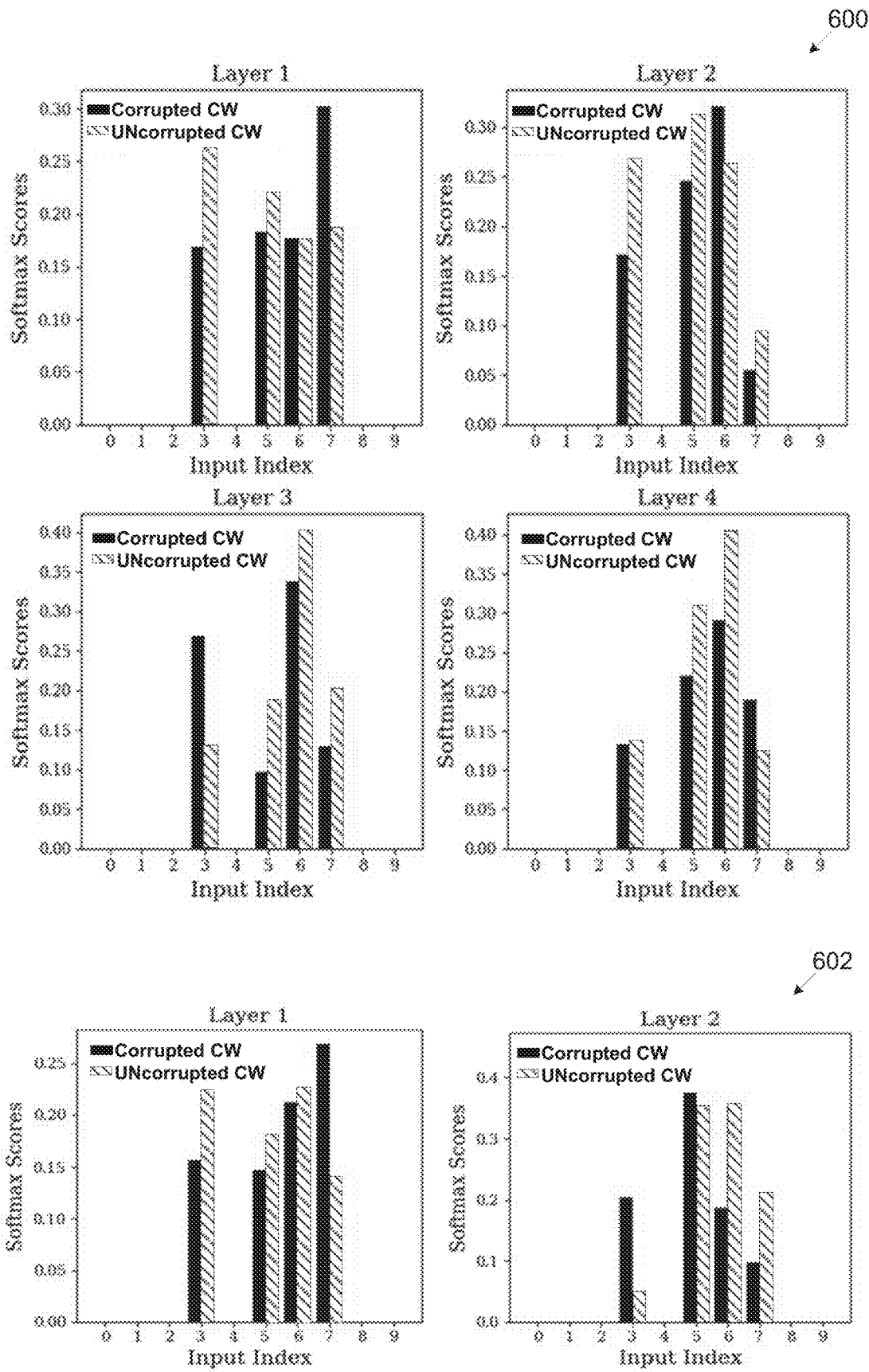
FIG. 6 presents graph charts illustrating impact of scaled embedding on self-attention layers of a transformer neural network based decoders trained to decode error correction codes, according to some embodiments of the present invention.

Reference is now made to FIG. 6, presents graph charts illustrating impact of scaled embedding on self-attention layers of a transformer neural network based decoders trained to decode error correction codes, according to some embodiments of the present invention.

Graph charts 600 and 602 present scaled embedding values of the first column of masked self-attention map with corrupted and uncorrupted codeword (CW) for a Hamming (7,4) code for two architectures of a transformer neural network based decoder such as the transformer neural network based decoder 108A (ECCT). Graph chart 600 relates to a first transformer neural network based decoder 108A having four decoding layers such as the decoding layers 204 and embedding dimension set to 32 (N=4, d=32) while graph chart 602 relates to a second transformer neural network based decoder 108A having two decoding layers 204 and embedding dimension set to 32 (N=2, d=32).

The corrupted and uncorrupted codeword (CW) are the zero codeword injected with additive noise at the first bit (zero bit index), involving a non-zero syndrome at the first parity check equation. The illustrations 600 and 602 present the masked softmax values of the self-attention map at index zero, i.e. the influence of the first (unreliable) bit on the self-attention aggregation (first column of the map).

As can be seen from 600 and 602, the first bit embedding has no impact when it is corrupted and then detectable, while the impact of the first bit embedding on the syndrome embedding is considerably increased. Once the transformer neural network based decoder 108A corrects the bit (last layers(s)), the values return to normal.

Figure 7:
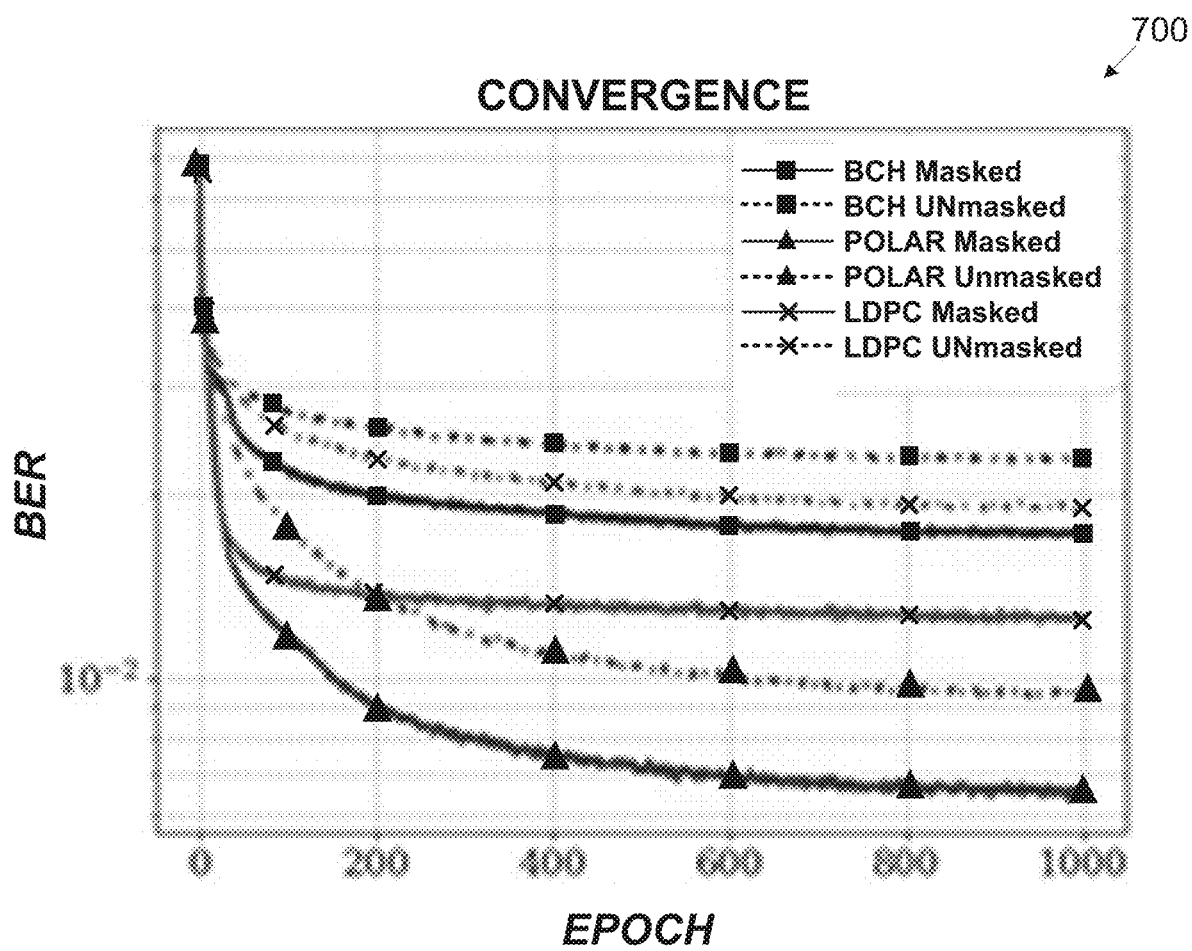
FIG. 7 is a graph chart illustrating impact of a mask on convergence of a transformer neural network based decoders trained to decode several error correction codes, according to some embodiments of the present invention.

Reference is also made to FIG. 7, which is a graph chart illustrating impact of a mask on convergence of a transformer neural network based decoders trained to decode several error correction codes, according to some embodiments of the present invention.

Graph chart 700 illustrates the impact of the mask applied in the decoding layers 204 on convergence of the transformer neural network based decoder 108A for three error correction codes, BCH(63,36), POLAR(64,32) and LDPC (49,24).

The graph chart 700 present convergence of the transformer neural network based decoder 108A applied to decode the BCH, Polar and LDPC codes when the transformer neural network based decoder 108A is completely unmasked such that is learns the code by itself (i.e. g (H)=0) compared to the transformer neural network based decoder 108A conditioned with the mask unmasking only the connected bits of the codes.

As evident for all three codes, convergence of the transformer neural network based decoder 108A applied with the mask is significantly faster than the convergence of the unmasked transformer neural network based decoder 108A. this may be traced to difficulties and limitations the unmasked transformer neural network based decoder 108A may experience in learning the code by itself. Therefore, as seen in the graph chart 700, the (bit) connectivity provided by the mask (masking framework) reduces the loss by 76%, 69% and 66% for the BCH(63,36), POLAR(64,32) and LDPC(49,24) codes, respectively.

Figure 8:
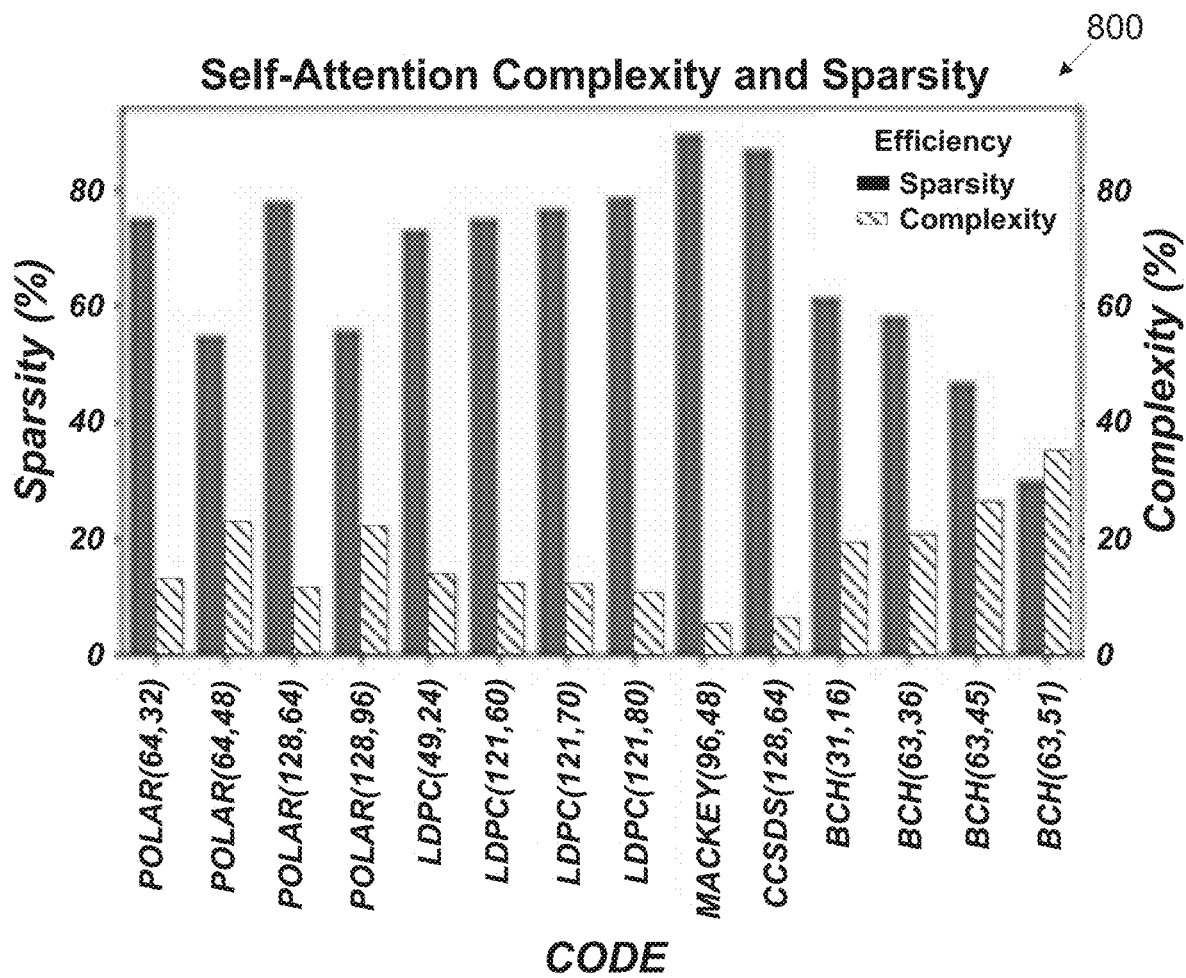
FIG. 8 is a graph chart illustrating impact of a mask on sparsity and complexity of self-attention layers a mask of a transformer neural network based decoders trained to decode several error correction codes, according to some embodiments of the present invention.

Reference is also made to FIG. 8, which is a graph chart illustrating impact of a mask on sparsity and complexity of self-attention layers a mask of a transformer neural network based decoders trained to decode several error correction codes, according to some embodiments of the present invention.

Graph chart 800 presents a sparsity ratio of the masked self-attention map, as well as the induced complexity ratio of the symmetric map of a transformer neural network based decoder 108A having six decoding layers 204 and embedding dimension of 64 (N=6, d=64) configured to decode several error correction codes.

The complexity ratio is computed with respect to the $O(n^2)$ legacy self-attention map size as known in the art. As can be seen ion the graph chart 800, the sparsity can exceed 80% for some of the codes (e.g. MACKEY(96,48) and CCSDS(128,64)) while the complexity, i.e., the additional pairwise computation ratios may range from 5 to 35% at most.

The complexity of the transformer neural network based decoder 108A may be defined by $O(N(d^2(2n-k)+hd))$ where $h \ll n^2$ denotes the fixed number of computations of the self-attention module employed by the decoding layers 204 of the transformer neural network based decoder 108A (ECCT). As with most neural network decoding approaches, while being extremely effective, the ECCT method may resource demanding compared to non-learning solutions in terms of memory requirement, power consumption, and computational resources, which may limit deployment potential of the transformer neural network based decoder 108A.

However, the transformer neural network based decoder 108A is still highly more efficient compared to the existing neural network based decoders. For example, the AR BP neural network may require $O(2N(nd_v d_f d_g + n^2 d_v + (n-k) 2 + d_f))$ more operations than the Hyper BP, where $d_v$, $d_f$, $d_g$ are the number of variable nodes, the capacity of the hyper-network and the capacity of the primary network, respectively. Typical networks $f(\ )$ and $g(\ )$ are a 128 dimensional FC network with four layers and a 16 dimensional FC network with two layers respectively. With these hyperparameters, the $nd_v d_f d_g$ part of the complexity is approximately $nd_v \cdot 128^2$.

Moreover, AR BP neural network may not be parallelized, due to its hyper-network structure since each sample may define a different set of parameters. Thus, the transformer neural network based decoder 108A far surpasses the existing state of the art error rates, with much less time complexity. The Hyper BP may be slightly less computationally intensive, since it adds a complexity term of $O(2Nnd_v d_f d_g)$ on top of BP, but this approach as well as BP model-based neural network of are far less competitive than the transformer neural network based decoder 108A in terms of accuracy.

According to some embodiments of the present invention, there are provided methods and systems for training and using neural network based decoder employing reverse diffusion to de-noise and decode error correction codewords transmitted over transmission channels subject to interference.

Denoising Diffusion Probability Models (DDPM) as known in the art, assume a data distribution $x_0 \sim q(x)$ and a Markovian noising process q which gradually adds interference (e.g., noise) to the data to produce noised samples $\{x_t\}_{t=1}^T$. Each step of the corruption process adds interference $\varepsilon$, for example, Gaussian noise according to some variance schedule given by $\beta_t$ which may be expressed by equation 10 below.

$$q(x_t|x_{t-1}) \sim \mathcal{N}(x_t; \sqrt{1-\beta_t} x_{t-1}, \beta_t I)$$

$$x_t = \sqrt{1-\beta_t} x_{t-1} + \sqrt{1-\beta_t} z_{t-1}, z_{t-1} \sim \mathcal{N}(0,I) \quad \text{Equation 10:}$$

The process $q(x_t|x_0)$ may be expressed as a Gaussian distribution such that $\alpha_t := 1 - \beta_t$ and $\overline{\alpha_t} := \prod_{s=0}^t \alpha_s$ such that equation 10 may be developed to the formulation expressed in equation 11 below.

$$q(x_t|x_0) \sim \mathcal{N}(x_t; \alpha_t x_0, (1-\overline{\alpha_t})I)$$

$$x_t = \sqrt{\overline{\alpha_t}} + \varepsilon \sqrt{1-\overline{\alpha_t}}, \varepsilon \sim \mathcal{N}(0,I) \quad \text{Equation 11:}$$

As known in the art, the intractable reverse diffusion process $q(x_{t-1}|x_t)$ approaches a diagonal Gaussian distribution as $\beta_t \to 0$ and may be approximated using a neural network $p_\theta(x_t)$ $t \to 0$ in order to predict the Gaussian statistics. The neural network model $p_\theta$ may be trained by stochastically optimizing the random terms of the variational lower bound of the negative log-likelihood function.

Using the Bayes' theorem, it may be demonstrated that the posterior is also Gaussian, making the objective a sum of tractable KL divergences between Gaussians.

As known in the art, a more practical objective may be defined via training of a neural network model $\varepsilon_\theta(x_t,t)$ predicting the additive noise $\varepsilon$ based on equation 12 below.

$$\mathcal{L}_{DDPM}(\theta) = E_{t \sim U[1,T], x_0 \sim q(x), \varepsilon \sim \mathcal{N}(0,I)} \|\varepsilon - \varepsilon_\theta(x_t, t)\|^2 \quad \text{Equation 12:}$$

The distribution $q(x_T)$ is assumed to be a nearly isotropic Gaussian distribution, such that sampling $x_T$ is trivial. Thus, the reverse diffusion process is given by the iterative process expressed in equation 13 below.

$$x_{t-1} = \frac{1}{\sqrt{\alpha_t}} \left( x_t - \frac{1-\alpha_t}{\sqrt{1-\overline{\alpha_t}}} \varepsilon_\theta(x_t, t) \right) \quad \text{Equation 12}$$

Figure 9:
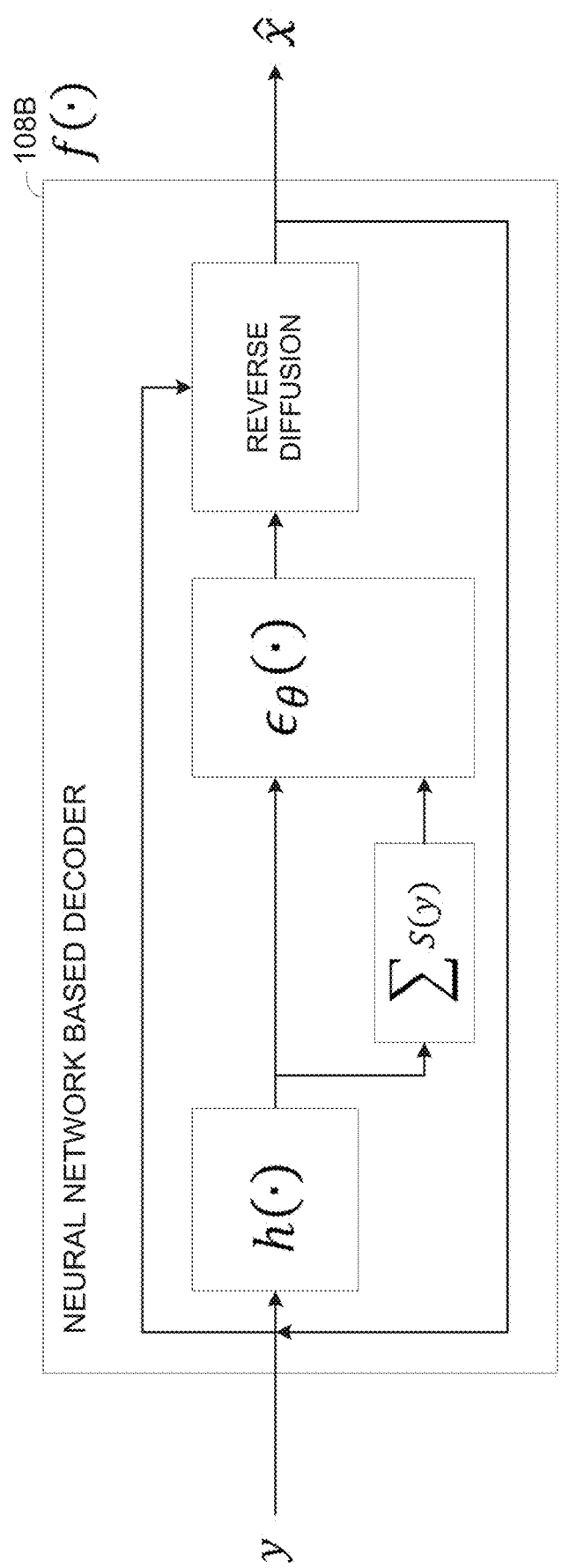
FIG. 9 is a schematic illustration of an exemplary transmission system comprising a trained neural network based decoder employing reverse diffusion to decode error correction codes transmitted over a transmission channel, according to some embodiments of the present invention.

Reference is now made to FIG. 9, which is a schematic illustration of an exemplary transmission system comprising a trained neural network based decoder employing reverse diffusion to decode error correction codes transmitted over a transmission channel, according to some embodiments of the present invention.

An exemplary neural network based decoder 108B ($f(\cdot)$) such as the neural network based decoder 108 may be trained and deployed to decode one or more error corrections codes transmitted by a transmitter such as the transmitter 102 over a transmission channel such as the transmission channel 106 subject to one or more interferences.

In particular, the neural network based decoder 108B may be a parameterized iterative decoder such as the decoder $f_\theta$ conditioned with the number of parity check errors of the error correction code which applies an iterative reverse diffusion process for decoding the received encoded codewords.

The neural network based decoder 108B may be configured and trained to apply reverse diffusion decoding $\varepsilon_\theta$ in order to de-noise, i.e., to remove the interference (noise) $\varepsilon$ from the received encoded codeword y and recover the codeword $\hat{x}$ by estimation.

The transmission of the encoded codeword x may be expressed as a forward diffusion process in which noise is gradually added to the encoded codeword over time.

Given a codeword $x_0$ sampled from the error correction code distribution $x_0 \sim q(x)$, the codeword transmission procedure $y = x_0 + \sigma \varepsilon$ may be defined as a forward diffusion process adding a small amount of interference, for example, Gaussian noise to the sample in t steps with $t \in (0, \ldots, T)$, where the step sizes are controlled by a variance schedule $\{\beta_t\}_{t=0}^T$. The unscaled forward diffusion process may be expressed by equation 13 below.

$$q(x_t := y|x_{t-1}) \sim \mathcal{N}(x_t; x_{t-1}, \beta_t I) \quad \text{Equation 13:}$$

Therefore, for a given received codeword y and for a corresponding time step t, y may be considered as a codeword that has been corrupted gradually as expressed by equation 14 below.

$$y := x_t = x_0 + \sigma \varepsilon, \varepsilon \sim \mathcal{N}(0, I) = \quad \text{Equation 14}$$
$$= x_0 + \sqrt{\overline{\beta_t}} \varepsilon, \sim \mathcal{N}(x_t; x_0, \overline{\beta_t} I)$$

Where $\overline{\beta_t} = \Sigma_{i=1}^t \beta_i$ and $\sigma$ define the level of corruption of the AWGN channel.

Thus, the transmission of data over noisy communication channels may be defined as a modified iterative diffusion process which may be reversed for decoding the received codeword y.

Following Bayes' theorem, the posterior process $q(x_{t-1}|x_t, x_0)$ may be expressed as Gaussian such that $q(x_{t-1}|x_t, x_0) \sim \mathcal{N}(x_t; \tilde{\mu}_t(x_t, x_0), \tilde{\beta}_t I)$. Developing the posterior process according to Bayes' theorem may be expressed in equation 15 below.

$$q(x_{t-1}|x_t, x_0) \sim q(x_t|x_{t-1}, x_0) \frac{q(x_{t-1}|x_0)}{q(x_t|x_0)} \propto$$

$$\exp\left(-\frac{1}{2}\left(\frac{(x_t - x_{t-1})^2}{\beta_t} + \frac{(x_{t-1} - x_0)^2}{1-\overline{\beta_t}} - \frac{(x_t - x_0)^2}{1-\overline{\beta_t}}\right)\right) =$$

$$\exp\left(-\frac{1}{2}\left(\left(\frac{1}{\beta_t} + \frac{1}{\overline{\beta_t}}\right)x_{t-1}^2 - \left(\frac{2}{\beta_t} - \frac{2}{\overline{\beta_t}}\right)x_{t-1} + C(x_t, x_0)\right)\right)$$

Equation 15 where $C(x_t, x_0)$ represents the constant term of the second order equation.

Following the standard Gaussian density function, the mean and variance may be parameterized as expressed in 16 below.

$$\tilde{\beta}_t = \left(\frac{1}{\beta_t} + \frac{1}{\overline{\beta_t}}\right)^{-1} \tilde{\mu}_t(x_t, x_0) =$$

$$\left(\frac{1}{\beta_t}x_t + \frac{1}{\overline{\beta_t}}x_0\right)\tilde{\beta}_t = \frac{\overline{\beta_t}}{\overline{\beta_t} + \beta_t}x_t + \frac{\beta_t}{\overline{\beta_t} + \beta_t}x_0 =$$

$$\frac{\overline{\beta_t}}{\overline{\beta_t} + \beta_t}x_t + \frac{\beta_t}{\overline{\beta_t} + \beta_t}\left(x_0 - \sqrt{\overline{\beta_t}}\varepsilon\right) = x_t - \frac{\sqrt{\overline{\beta_t}}\beta_t}{\overline{\beta_t} + \beta_t}\varepsilon$$

Equation 16

Combining equations 14 and 16 may yield the formulation expressed in equation 17 below.

$$\begin{cases} \tilde{\mu}_t(x_t, x_0) = \frac{\overline{\beta_t}}{\overline{\beta_t} + \beta_t}x_t + \frac{\beta_t}{\overline{\beta_t} + \beta_t}x_0 = x_t - \frac{\sqrt{\overline{\beta_t}}\beta_t}{\overline{\beta_t} + \beta_t}\varepsilon \\ \tilde{\beta}_t = \frac{\overline{\beta_t}\beta_t}{\overline{\beta_t} + \beta_t} \end{cases}$$

Equation 17

As known in the art, the intractable Gaussian reverse diffusion process $q(x_t|x_{t-1})$ may be approximated as expressed in equation 18 below.

$$q(x_t|x_{t-1}) \approx p_\theta(x_t|x_{t-1}) \sim \mathcal{N}(x_t; \mu_\theta(x_t,t), \tilde{\beta}_t I)$$

Equation 18:

with a fixed variance $\tilde{\beta}_t$.

Adapt the negative log-likelihood approximation as known in the art, the decoder $f_\theta$ may predict the additive noise of the adapted diffusion process as expressed in equation 19 below.

$$\mathcal{L}(\theta) = E_{t \sim U[1,T], x_0 \sim q(x), \varepsilon \sim \mathcal{N}(0,I)}[\|\varepsilon - \varepsilon_\theta(x_0 + \beta_t^{-1/2}\varepsilon, t)\|^2]$$

Equation 19:

As known in the art, a notable property of the syndrome-based approach is that, similarly to denoising diffusion models, the objective of the reverse diffusion decoder $\varepsilon_\theta$ is to predict the channel's noise in order to estimate and retrieve the original codeword decoder x.

However, in contrast to the classic diffusion models, the syndrome based approach enforces prediction of the multiplicative noise $\tilde{\varepsilon}$ rather than the additive noise $\varepsilon$. However, while its exact value may be of no importance for hard decoding, the sign of the of the multiplicative noise $\tilde{\varepsilon}$ must be accounted for since $\tilde{x}_s = \text{sign}(y\tilde{\varepsilon})$.

Therefore, the hard prediction (i.e., the sign) of the multiplicative noise $\tilde{\varepsilon}$ may be learned using a binary cross entropy loss as a surrogate objective as expressed in equation 20 below.

$$\mathcal{L}(\theta) = -E_{t,x_0,\varepsilon} \log(\varepsilon_\theta(x_0 + \beta_t^{-1/2}\varepsilon, t), \tilde{\varepsilon}_b)$$

Equation 19:

where the target binary multiplicative noise is defined as $$\tilde{\varepsilon}_b = \text{bin}(x_0(x_0 + \beta_t^{-1/2}\varepsilon)).$$

The reverse denoising process of traditional DDPM is conditioned by the time step t. Thus, by sampling the Gaussian noise at step t=T, the diffusion process may be fully reversed by up to T iterations. For the error correction code decoding, a generative model may be of lesser interest, and rather an exact iterative denoising scheme where the original signal is only corrupted to a measured extent may be highly useful.

Moreover, a codeword y encoded according to a given error correction code which is injected with interference may convey information about the level of interference (noise) via its syndrome s since $s(y) = H_y = H_x + H_z = H_z$.

Figure 10:
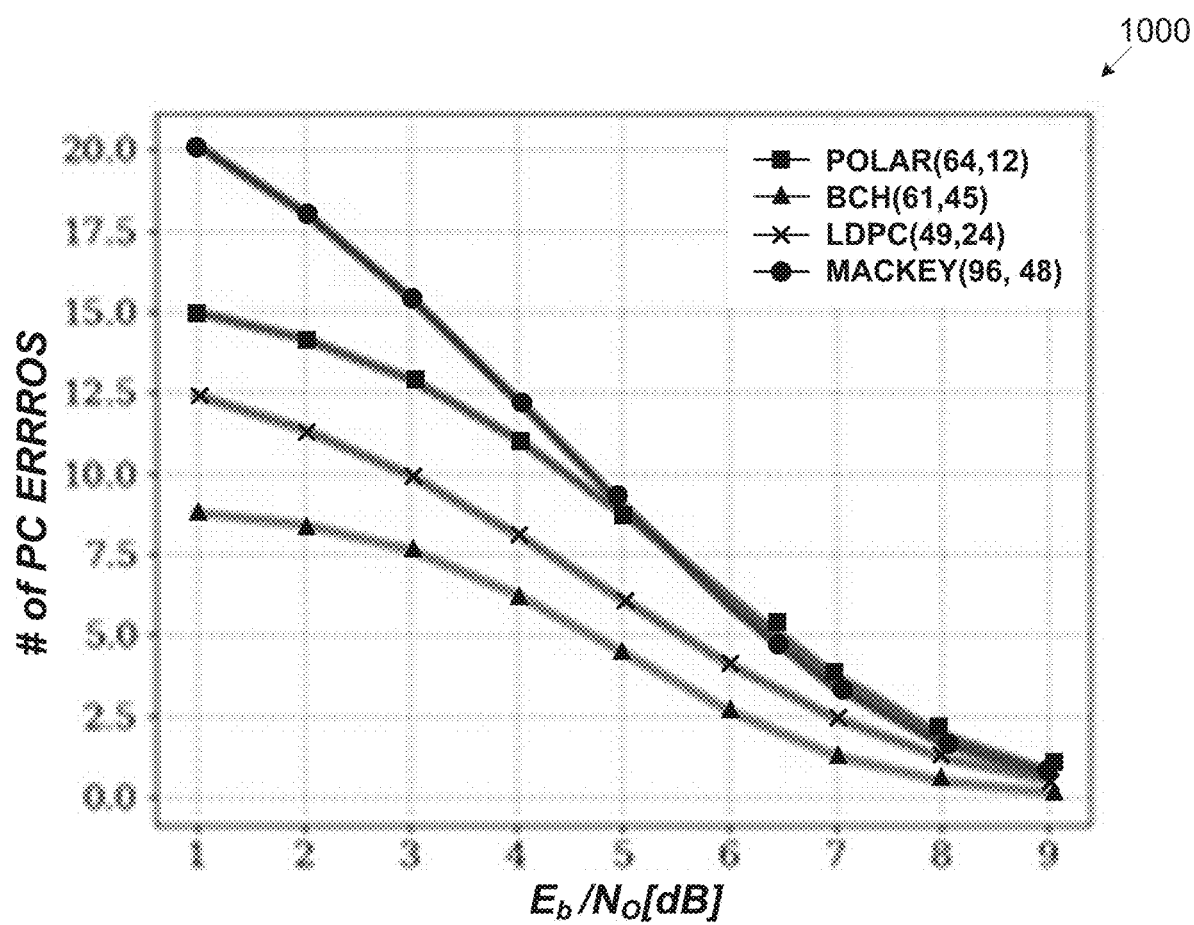
FIG. 10 is a graph chart illustrating impact of a normalized noise on a number of parity check errors in error correction codes transmitted over a transmission channel subject to interference.

Reference is now made to FIG. 10, which is a graph chart illustrating impact of a normalized noise on a number of parity check errors in error correction codes transmitted over a transmission channel subject to interference.

Graph chart 1000 illustrates impact of interference on the number of parity check (PC) errors for a codeword encoded according to several error correction codes, specifically, POLAR(64,12), BCH(61,45), LDPC(49,24), and MACKEY (96,48).

As can be seen, the interference expressed by normalized SNR ($E_b/N_O$) significantly affects the number of parity check errors for all codes. Specifically, the number of parity check errors increases when the interference is bigger such that the lower the SNR, i.e., the bigger is the interference, the higher is the number of parity check errors demonstrating that the syndrome is highly indicative of the interference (noise) level.

An injective function may be therefore approximated between the number of parity check errors and the level (amount) of interference. The number of denoising steps T=n–k applied by the reverse diffusion based decoder 108B may be set according to the maximum number of parity check errors indicated by the syndrome of the received codeword. Similarly, sampling a time step t~U (0, . . . , T) may produce an interference (noise) which itself induces a certain number of parity checks.

Therefore, the neural network based decoder 108B employing reverse diffusion may be conditioned according to the number of parity checks errors e t at each of the time steps t expressed by equation 20 below.

$$e_t := e(x_t) = \Sigma_{i=1}^{n-k} s(x_t)_i \in \{0, \ldots, n-k\}$$

Equation 20:

The resulting training objective may be therefore defined by equation 21 below.

$$\mathcal{L}(\theta) = -E_{t,x_0,\varepsilon} \log(\varepsilon_\theta(x_0 + \beta_t^{-1/2}\varepsilon, e_t), \tilde{\varepsilon}_b)$$

Equation 21:

The iterative reverse diffusion process $\varepsilon_\theta(\cdot)$ relying on the syndrome generated based on the parity check bits is illustrated for the neural network based decoder 108B in FIG. 9 by the check matrix $h(\cdot)$ which produced a cumulative syndrome $\Sigma s(y)$ for the received encoded codeword y.

Figure 11:
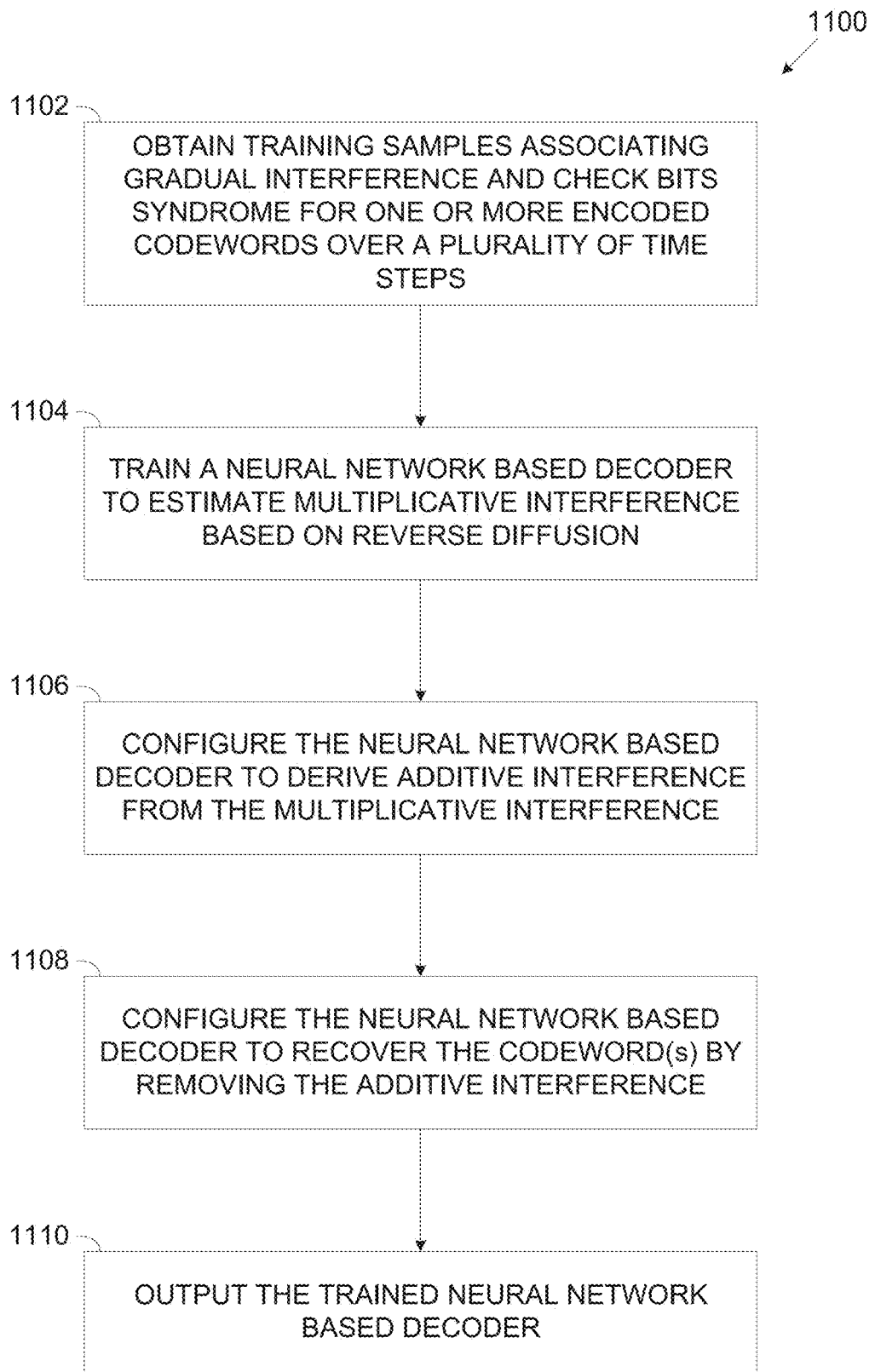
FIG. 11 is a flowchart of an exemplary process of training a neural network based decoder employing reverse diffusion to decode error correction codes, according to some embodiments of the present invention.
Figure 12:
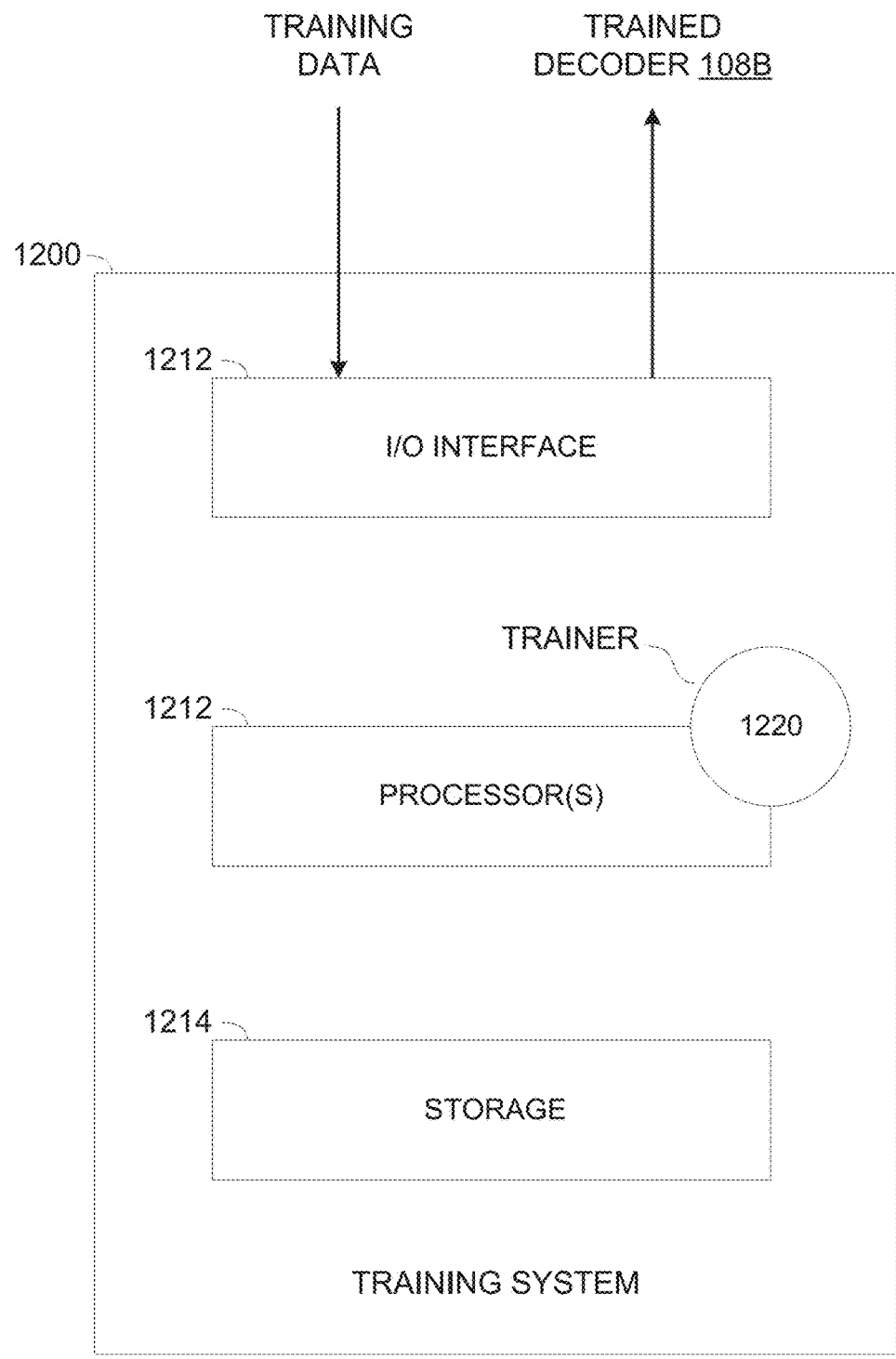
FIG. 12 is a schematic illustration of an exemplary system for training a neural network based decoder employing reverse diffusion to decode error correction codes, according to some embodiments of the present invention.

Reference is now made to FIG. 11, which is a flowchart of an exemplary process of training a neural network based decoder employing reverse diffusion to decode error correction codes, according to some embodiments of the present invention. Reference is also made to FIG. 12, which is a schematic illustration of an exemplary system for training a neural network based decoder employing reverse diffusion to decode error correction codes, according to some embodiments of the present invention.

An exemplary process 1100 may be executed by an exemplary training system 1200 for training and configuring a neural network based decoder employing reverse diffusion such as the neural network based decoder 108B to decode one or more codewords encoded according to one or more error correction codes and transmitted over a transmission channel such as the transmission channel 106 subject to interference.

The training system 1200, for example, a computer, a server, a computing node, a cluster of computing nodes and/or the like may comprise an Input/Output (I/O) interface 1210, a processor(s) 1212 for executing a process such as the process 1100 and a storage 1214 for storing code (program store) and/or data.

The I/O interface 1210 may comprise one or more wired and/or wireless interfaces, for example, a Universal Serial Bus (USB) interface, a serial interface, a Radio Frequency (RF) interface, a Bluetooth interface and/or the like. The I/O interface 1210 may further include one or more network and/or communication interfaces for connecting to one or more wired and/or wireless networks, for example, a Local Area Network (LAN), a Wireless Local Area Network (WLAN), a Wide Area Network (WAN), a Municipal Area Network (MAN), a cellular network, the internet and/or the like.

The processor(s) 1212, homogeneous or heterogeneous, may include one or more processing nodes arranged for parallel processing, as clusters and/or as one or more multi-core processor(s). The storage 1214 may include one or more non-transitory memory devices, either persistent non-volatile devices, for example, a hard drive, a solid state drive (SSD), a magnetic disk, a Flash array and/or the like. The storage 1214 may also include one or more volatile devices, for example, a Random Access Memory (RAM) device, a cache memory and/or the like. The storage 1214 may further include one or more network storage resources, for example, a storage server, a network accessible storage (NAS), a network drive, a cloud storage and/or the like accessible via the I/O interface 1210.

The processor(s) 1212 may execute one or more software modules, for example, a process, a script, an application, an agent, a utility, a tool, an Operating System (OS) and/or the like each comprising a plurality of program instructions stored in a non-transitory medium such as the storage 1214 and executed by one or more processors such as the processor(s) 1212.

The processor(s) 1212 may further include, integrate and/or utilize one or more hardware modules (elements integrated and/or utilized in the training system 1200, for example, a circuit, a component, an Integrated Circuit (IC), an Application Specific Integrated Circuit (ASIC), a Field Programmable Gate Array (FPGA), a Digital Signals Processor (DSP), a Graphical Processing Unit (GPU), an Artificial Intelligence (AI) accelerator and/or the like.

The processor(s) 1212 may therefore execute one or more functional modules utilized by one or more software modules, one or more of the hardware modules and/or a combination thereof. For example, the processor(s) 1212 may execute a trainer 1220 functional module for executing the process 1100 to train one or more neural network based decoders employing reverse diffusion such as the neural network based decoders 108B.

Via the I/O interface the trainer 1220 may obtain a plurality of training samples which may be used to train the neural network based decoder(s) 108B employing reverse diffusion. For example, the trainer 1220 may communicate with one or more remote network resources, for example, a server, a storage resource, a database, and/or the like to receive one or more of the training samples. In another example, the trainer 1220 may retrieve one or more of the training samples from one or more storage media devices attached to one or more of the interfaces and/or ports of the I/O interface 1210. Similarly, the trainer 1220 may output the trained neural network based decoder(s) 108B via the I/O interface 1210.

Optionally, the training system 1200 and/or the trainer 1220 may be provided, executed and/or utilized at least partially by using one or more cloud computing services, for example, Infrastructure as a Service (IaaS), Platform as a Service (PaaS), Software as a Service (SaaS) and/or the like provided by one or more cloud infrastructures and/or services such as, for example, Amazon Web Service (AWS), Google Cloud, Microsoft Azure. IBM cloud and/or the like.

Training the neural network based decoder 108B may be done in one or more training sessions.

As shown at 1102, the process 100 starts with the trainer 1220 receiving a plurality of training samples comprising one or more codewords encoded according to a given error correction code and transmitted via a transmission channel such as the transmission channel 106 subject to interference.

In particular, the training samples may express a diffusion process in which the samples are subject to gradual noise at a plurality of time steps. Each of the plurality of training samples may therefore associate one or more encoded codewords with an interference level and a parity check syndrome at one or more of the plurality of time steps.

It should be noted that the model-free Diffusion Decoding Error Correction Code (DDECC) may be invariant to the transmitted codeword, and the neural network based decoder 108B may be therefore trained with a single codeword $x_0$, optionally the zero codeword. The plurality of training samples may therefore comprise at least the zero codeword.

As shown at 1104, the trainer 1220 may train neural network based decoder 108B, specifically the DDECC decoder $\in_\theta$ to estimate (predict) the multiplicative interference (noise) $\varepsilon$ of received codeword encoded using the error correction code.

Trained with the plurality of training samples indicative of the interference levels at the plurality of time steps and the corresponding parity check syndrome resulting from theses the interference levels, the neural network based decoder 108B may learn the diffusion process typical to the error correction code transmitted over the transmission channel 106 and the interference it is subject.

The learned neural network based decoder 108B may therefore estimate (predict) the interference injected to the codewords transmitted over the transmission channel 106 and may estimate (recover) the codeword originally encoded and transmitted from the transmitter 102.

The trainer 1220 may apply one or more optimization functions, for example, binary cross-entropy loss (BCE) for training the neural network based decoder 108B as described in pseudo-code excerpt 2 of an exemplary BCE based training algorithm.

In a basic setting random time sampling may be applied, meaning that the distribution of the plurality of time steps t over time may be selected randomly. The selected distribution may produce a certain interference (e.g., noise) at each of the time steps and then a syndrome, indicative of the certain interference, to be corrected.

| Pseudo-Code Excerpt 2: DDECC Training Algorithm |
|---|
| 1    $x_0 \in C$ |
| 2    input: parity check matrix H, interference schedule $\beta_1, \ldots, \beta_T$ |
| 3    repeat |
| 4    $t \sim U(\{1, \ldots, T\})$ |
| 5    $\varepsilon \sim \mathcal{N}(0, I)$ |
| 6    $x_t = x_0 + \sqrt{\beta_t}\varepsilon = x_0\tilde{\varepsilon}$ |
| 12    take gradient descend step on: |
| 6    $BCE(\varepsilon_\theta(x_t, e_t), bin(\tilde{\varepsilon}))$ |
| 13    continue until converged |

As shown at 1106, Since the neural network based decoder 108B, specifically the DDECC $\varepsilon_\theta$ is trained to estimate (predict) the multiplicative noise $\varepsilon$, the trainer 1220 may configure the neural network based decoder 108B to derive the additive interference $\hat{\varepsilon}$ from the estimated multiplicative noise $\tilde{\varepsilon}$ in order to perform the gradient step in the original additive diffusion process domain.

The neural network based decoder 108B may be configured to compute the additive interference $\hat{\varepsilon}$ by subtracting the predicted codeword bin($\hat{x}$) from the received codeword y (i.e., the transmission channel output) according to equation 22 below.

$\hat{\varepsilon} = y - \text{sign}(\hat{x}) = y - \text{sign}([|\$]\$\char`\^\$\$[|\$]\$\char`\^ A\hat{T}[|\$]$
$\$\char`\^ gy)$    Equation 22:

As shown at 1108, the trainer 1220 may configure the neural network based decoder 108B to recover the codeword x by reversing the process expressed in equation 17 as formulated by equation 23 below.

$$x_{t-1} = x_t - \frac{\sqrt{\bar{\beta}_t}\beta_t}{\bar{\beta}_t + \beta_t}(x_t - \text{sign}(x_t\tilde{\varepsilon})) = \quad \text{Equation 22}$$

$$x_t - \frac{\sqrt{\bar{\beta}_t}\beta_t}{\bar{\beta}_t + \beta_t}(x_t - \text{sign}(x_t\varepsilon_\theta(x_t, e_t)))$$

As shown at 1110, the trainer may output the trained neural network based decoder 108B.

Optionally, the time steps the distribution of the plurality of time steps over time may be optimized by applying an iterative process to identify an optimal time step size $\lambda$ which minimizes the parity check syndrome for one or more recovered codewords, for example, one or more of the training samples.

A major limitation of the generative neural diffusion process $\varepsilon_\theta$ is that a large number of diffusion steps, which may amount to a thousand time steps, may be required in order to accurately decode (recover) encoded codewords and generate high-quality samples. The quality of the recovered codewords may be assessed based on the value of its syndrome, i.e., the number of parity check errors where a zero syndrome means a valid codeword with no errors.

The optimal time step size $\lambda$ may be therefore identified and selected by selecting a plurality of candidate time step sizes $\lambda$, evaluating the decoding performance of the neural network based decoder 108B for each of the candidate time step sizes $\lambda$ and selecting the optimal time step size $\lambda$ yielding the best decoding performance. Selecting the optimal time step size A may be done by solving the optimization problem of equation 23 below.

$$\lambda^* = \underset{\lambda \in R^+}{\text{argmin}} \left\| s\left(x_t - \lambda\frac{\sqrt{\bar{\beta}_t}\beta_t}{\bar{\beta}_t + \beta_t}\hat{\varepsilon}\right) \right\|_1 \quad \text{Equation 23}$$

where $s(\cdot)$ denotes the syndrome computed over the order-two Galois field as described in equation 2.

One or more line searches may be applied to optimize the time step size A. For example, the optimal time step size A may be obtained using a grid search which may restrict the search space for selecting the distribution of the plurality of time steps over time.

The grid search procedure may restrict search space to $\lambda \in I$ where I may be a predefined discrete segment. This parallelizable procedure may reduce the number of iterations by a sizable factor, as demonstrated by experiments herein after. For example, the discrete grid search of the time step size A may be uniformly sampled over I=[1,20] with 20 samples, in order to find the best possible time step size A. A denser sampling may improve the results at the expense of a possible increase in the computing resources utilization. The sampling range and distribution may be therefore adapted according to a given computation-speed vs. decoding performance trade-off.

Figure 13:
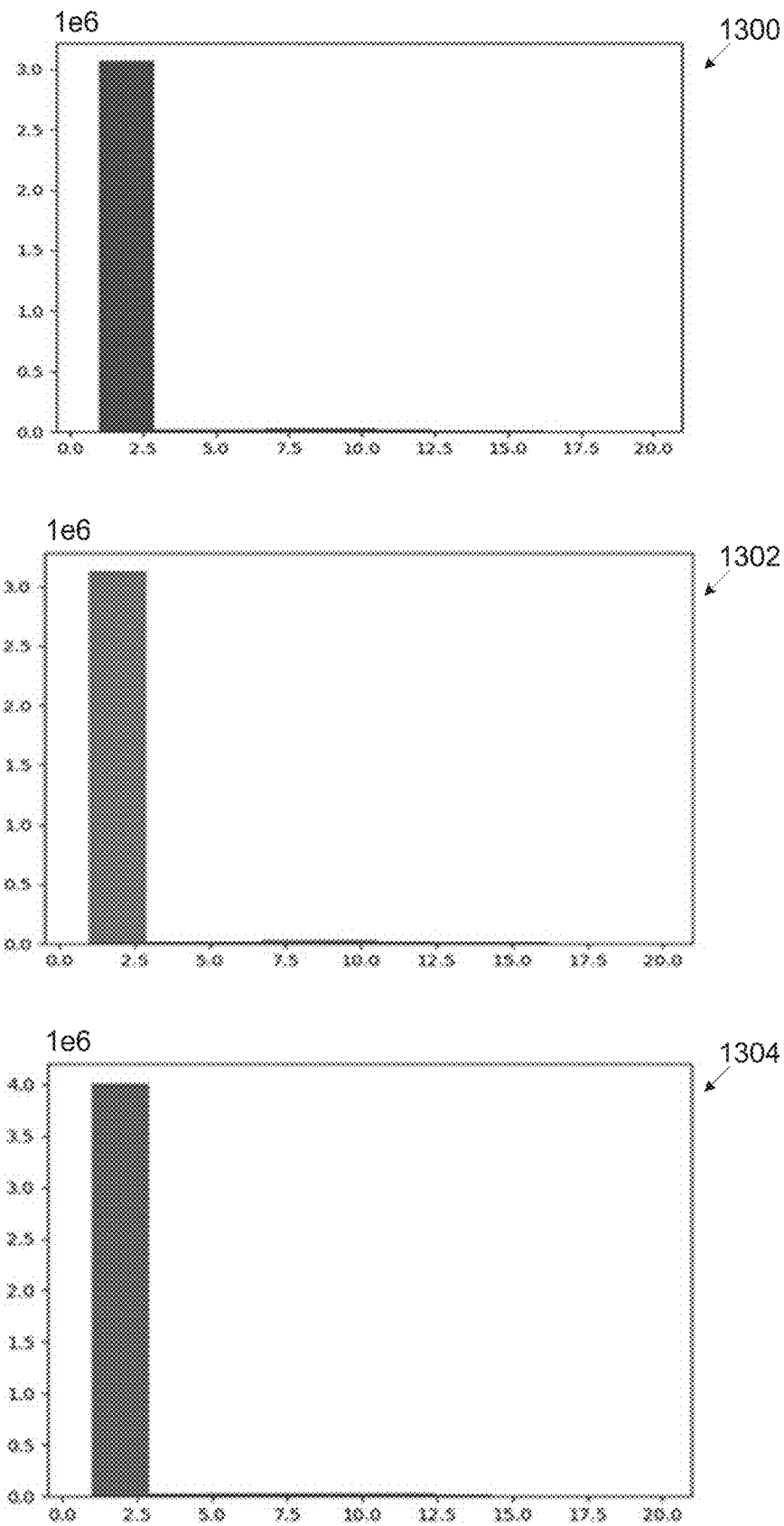
FIG. 13 presents histograms illustrating distribution of exemplary time steps optimized for training a neural network based decoder employing reverse diffusion to decode an error correction code, according to some embodiments of the present invention.

Reference is now made to FIG. 13, which presents histograms illustrating distribution of exemplary time steps optimized for training a neural network based decoder employing reverse diffusion to decode an error correction code, according to some embodiments of the present invention.

Histograms 1300, 1302 and 1304 illustrate optimal $\lambda$ values for POLAR(128,96) code, for SNR $E_b/N_O=\{4,5,6\}$, respectively. The grid search was uniformly sampled with 300 samples on the presented range.

The process 1110 may be applied to train and configure neural network based decoders 108B employing a plurality of neural network architectures, for example, FC, CNN, FF, RNN and/or the like.

Optionally, the neural network based decoder 108B trained by the trainer 1220 executing the process 1100 may be implemented using one or more transformer neural networks, specifically an ECCT such as the transformer neural network based decoder 108A. In particular, the transformer neural network based decoder 108A trained and adapted to employ reverse diffusion, thus designated transformer neural network based decoder 108B, may be conditioned for the selected error correction code according to a number of parity errors detected in the code. The transformer neural network based decoder 108B may be conditioned by employing a multi-dimension one hot decoding to a Hadamard product of an initial embedding created for the bits of the at least one codeword.

The capacity of the ECCT model is defined according to the selected (chosen) embedding dimension d and the number of self-attention layers N as described herein before. In order to condition it by the number of parity errors $e_t \in \{0, \ldots, n-k\}$, the transformer neural network based decoder 108B may be conditioned by employing a d dimension one hot decoding multiplied via Hadamard product with the initial elements' embedding of the ECCT. Denoting the ECCT's embedding of the i element $\phi_i$, the new embedding is defined as $\tilde{\phi}_i = \phi_i(\cdot)\psi(e_t)$, $\forall i$ where $\psi$ denotes the n-k one hot embedding. As a transformation of the syndrome, $e_t$ remains also invariant to the codeword.

The trained neural network based decoder 108B may be used to decode one or more codewords encoded according to the error correction code which the neural network based decoder 108B is trained and adapted for.

The trained neural network based decoder 108B may execute an exemplary inference algorithm described in pseudo-code 3 to decode, i.e., estimate and recover the received encoded codeword which are injected with interference.

---
Pseudo-Code Excerpt 3: DDECC Inference Algorithm
---
1 input: parity check matrix H, received codeword y (channel output)
2 for n − k iteration do
3  $\gamma = e(bin(y))$
4  if $\gamma = 0$ then
5   return bin(y)
6  end if
7  $\hat{\varepsilon} = \varepsilon_\theta(y, \gamma)$
8  $\tilde{\varepsilon} = y - \text{sign}(\hat{\varepsilon} y)$
9  get $\lambda$ according to equation 23

10  $y = y - \lambda \dfrac{\overline{\beta_\gamma} \beta_\gamma}{\overline{\beta_\gamma} + \beta_\gamma} \tilde{\varepsilon}$ 11 end for
12 return bin(y)

---

As seen in the DDECC inference algorithm, in case the syndrome is non-zero, the trained neural network based decoder 108B may predict (estimate) the multiplicative noise e, derive (extract) the corresponding additive noise $\tilde{\varepsilon}$ and perform the reverse diffusion step.

Figure 14:
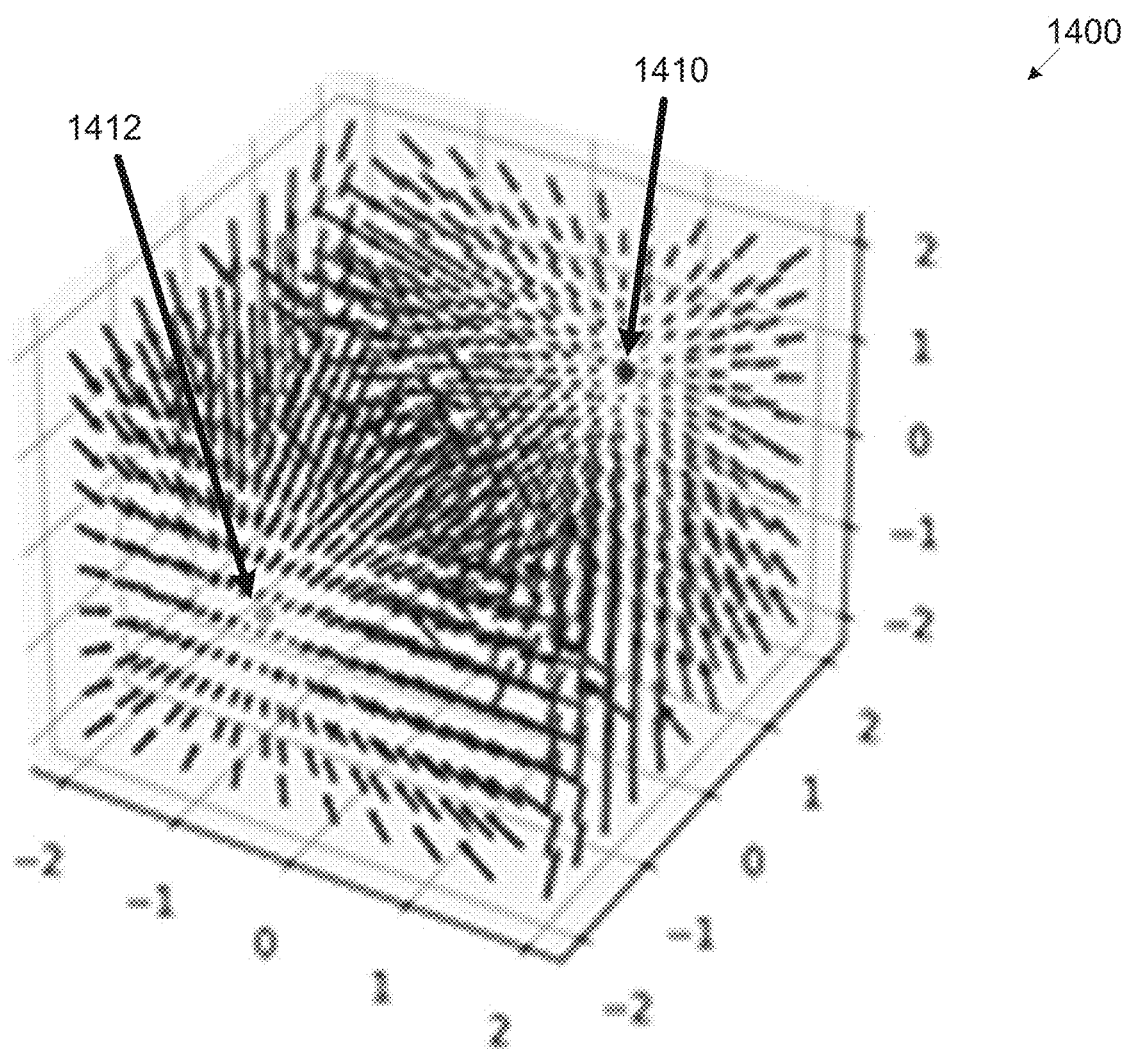
FIG. 14 is a schematic illustration of reverse diffusion dynamics for an exemplary error correction code decoded using a trained neural network based decoder employing reverse diffusion, according to some embodiments of the present invention.

Reference is now made to FIG. 14, which is a schematic illustration of reverse diffusion dynamics for an exemplary error correction code decoded using a trained neural network based decoder employing reverse diffusion, according to some embodiments of the present invention.

Illustration 1400 presents the reverse diffusion dynamics (gradient field) for a (3,1) repetition code, i.e., G=(1,1,1). The two point 1410 and 1412 represent the two only signed codewords: (1,1,1) and (−1,−1,−1) respectively. As seen, the denoising (reverse) diffusion model may reverse the noisy codewords towards the right distribution.

Presented herein are experiments conducted to evaluate and demonstrate the performance of a transformer neural network based decoder 108B trained and configured for reverse diffusion decoding.

The transformer neural network based decoder 108B was trained used with 128 samples per mini-batch for 2000 epochs, with 1000 mini-batches per epoch. The noise scheduling is constant and set to $\beta_t$, $\forall t$. The learning rate was initialized to $10^{-4}$ coupled with a cosine decay scheduler down to $5 \cdot 10^{-6}$ at the end of the training. No warmup was employed.

Training and experiments have been performed on a 12 GB Titan V GPU. The total training time ranges from 12 to 24 hours depending on the code length, and no optimization of the self-attention mechanism has been employed. Per epoch, the training time was in the range of 19-40, 40-102 seconds for the N=2,6 architectures, respectively.

The transformer neural network based decoder 108A was evaluated for decoding three classes of linear block error correction codes, LDPC codes, Polar codes, and Bose-Chaudhuri-Hocquenghem (BCH) codes. Parity check matrices as known in the art are used for these codes. As described herein before, the architecture of the transformer neural network based decoder 108B is defined solely by the number N of its encoding layers and the dimension d of the embedding.

Performance of the transformer neural network based decoder 108B employing the reverse diffusion decoding, thus designated DDECC Transformer (DDECCT), was compared to several existing state of the art decoders, including the BP algorithm (designated BP), the autoregressive BP (designated AR BP) and the transformer neural network based decoder 108A (ECCT) described herein before which does not employ reverse diffusion decoding.

The results of the experiments are reported in table 2 below in terms of the negative natural logarithm of the Bit Error Rate (BER) for different normalized SNR values (dB). During testing, the decoders are applied to decode at least $10^5$ random codewords in order to obtain at least 500 frames with errors at each SNR value.

TABLE 2

| | | | | Algorithm | | | | | |
| | BP | | | AR BP | | | ECCT (N = 2) | | |
| Code | 4 | 5 | 6 | 4 | 5 | 6 | 4 | 5 | 6 |
|---|---|---|---|---|---|---|---|---|---|
| Polar  | 3.52  | 4.04 | 4.48  | 4.77 | 6.30 | 8.19  | 4.27  | 5.44 | 6.95 |
| (64, 32) | 4.326 | 5.38 | 6.50  | 5.57 | 7.43 | 9.82  | 4.57  | 5.86 | 7.50 |
|        | —     | —    | —     | —    | —    | —     | 4.87  | 6.20 | 7.93 |
| Polar  | 4.15  | 4.68 | 5.31  | 5.25 | 6.96 | 9.00  | 4.92  | 6.46 | 8.41 |
| (64, 43) | 4.74  | 5.94 | 7.42  | 5.41 | 7.19 | 9.30  | 5.14  | 6.78 | 8.90 |
|        | —     | —    | —     | —    | —    | —     | 5.366 | 7.12 | 9.39 |
| Polar  | 3.38  | 3.80 | 4.15  | 4.02 | 5.48 | 7.55  | 3.51  | 4.52 | 5.93 |
| (128, 64) | 4.10 | 5.11 | 6.15  | 4.84 | 6.78 | 9.30  | 3.83  | 5.16 | 7.04 |
|        | —     | —    | —     | —    | —    | —     | 4.04  | 5.52 | 7.62 |
| Polar  | 3.80  | 4.19 | 4.62  | 4.81 | 6.57 | 9.04  | 4.30  | 5.58 | 7.34 |
| (128, 86) | 4.49 | 5.64 | 6.97  | 5.39 | 7.37 | 10.13 | 4.49  | 5.90 | 7.75 |
|        | —     | —    | —     | —    | —    | —     | 4.75  | 6.25 | 8.29 |
| Polar  | 3.99  | 4.41 | 4.78  | 4.92 | 6.73 | 9.30  | 4.56  | 5.98 | 7.93 |
| (128, 96) | 4.61 | 5.79 | 7.08  | 5.27 | 7.44 | 10.20 | 4.69  | 6.20 | 8.30 |
|        | —     | —    | —     | —    | —    | —     | 4.88  | 6.58 | 8.93 |
| LDPC   | 5.30  | 7.28 | 9.88  | 6.05 | 8.13 | 11.68 | 4.51  | 6.07 | 8.11 |
| (49, 24) | 6.23 | 8.19 | 11.72 | 6.58 | 9.39 | 12.39 | 4.58  | 6.18 | 8.46 |
|        | —     | —    | —     | —    | —    | —     | 4.71  | 6.38 | 8.73 |
| LDPC   | 4.82  | 7.21 | 10.87 | 5.22 | 8.31 | 13.07 | 3.88  | 5.51 | 8.06 |
| (121, 60) | —   | —    | —     | —    | —    | —     | 3.89  | 5.55 | 8.16 |
|        | —     | —    | —     | —    | —    | —     | 3.93  | 5.66 | 8.51 |

TABLE 2-continued

| Code | | | | | | | | | |
|---|---|---|---|---|---|---|---|---|---|
| LDPC (121, 70) | 5.88 | 8.76 | 13.04 | 6.45 | 10.01 | 14.77 | 4.63 | 6.68 | 9.73 |
| | — | — | — | — | — | — | 4.64 | 6.71 | 9.77 |
| | — | — | — | — | — | — | 4.67 | 6.79 | 9.98 |
| LDPC (121, 80) | 6.66 | 9.82 | 13.98 | 7.22 | 11.03 | 15.90 | 5027 | 7.59 | 10.08 |
| | — | — | — | — | — | — | 5.29 | 7.63 | 10.90 |
| | — | — | — | — | — | — | 5.30 | 7.65 | 11.03 |
| MacKey (96, 48) | 6.94 | 9.40 | 12.57 | 7.43 | 10.65 | 14.65 | 4.95 | 6.67 | 8.94 |
| | — | — | — | — | — | — | 5.04 | 6.80 | 9.23 |
| | — | — | — | — | — | — | 5.17 | 7.07 | 9.64 |
| CCSDS (128, 64) | 6.55 | 9.65 | 13.78 | 7.25 | 10.99 | 16.36 | 4.35 | 6.01 | 8.30 |
| | — | — | — | — | — | — | 4.41 | 6.09 | 8.49 |
| | — | — | — | — | — | — | 4.59 | 6.42 | 9.02 |
| BCH (63, 36) | 3.72 | 4.65 | 5.66 | 4.33 | 5.94 | 8.21 | 3.79 | 4.87 | 6.35 |
| | 4.03 | 5.42 | 7.26 | 4.57 | 6.39 | 8.92 | 4.05 | 5.28 | 7.01 |
| | — | — | — | — | — | — | 4.21 | 5.50 | 7.25 |
| BCH (63, 45) | 4.08 | 4.96 | 6.07 | 4.80 | 6.43 | 8.69 | 4.47 | 5.88 | 7.81 |
| | 4.36 | 5.55 | 7.26 | 4.97 | 6.90 | 9.41 | 4.66 | 6.16 | 8.17 |
| | — | — | — | — | — | — | 4.79 | 6.39 | 8.49 |
| BCH (63, 51) | 4.34 | 5.29 | 6.35 | 4.95 | 6.69 | 9.18 | 4.60 | 6.05 | 8.05 |
| | 4.50 | 5.82 | 7.42 | 5.17 | 7.16 | 9.53 | 4.78 | 6.34 | 8.49 |
| | — | — | — | — | — | — | 5.01 | 6.72 | 9.03 |

| | Algorithm | | | | | | | | |
|---|---|---|---|---|---|---|---|---|---|
| | ECCT (N = 6) | | | DDECCT (N = 2) | | | DDECCT (N = 6) | | |
| Code | 4 | 5 | 6 | 4 | 5 | 6 | 4 | 5 | 6 |
| Polar (64, 32) | 5.71 | 7.63 | 9.94 | 6.17 | 8.27 | 11.14 | 6.76 | 9.14 | 12.31 |
| | 6.48 | 8.60 | 11.43 | 6.46 | 8.51 | 11.67 | 6.90 | 9.43 | 12.85 |
| | 6.99 | 9.44 | 12.32 | 6.72 | 9.12 | 12.10 | 6.93 | 9.51 | 12.79 |
| Polar (64, 43) | 5.82 | 7.81 | 10.24 | 5.62 | 7.74 | 10.28 | 5.98 | 8.02 | 10.94 |
| | 6.15 | 8.20 | 10.86 | 5.75 | 7.90 | 10.52 | 5.98 | 8.26 | 11.13 |
| | 6.36 | 8.46 | 11.09 | 5.84 | 7.92 | 10.67 | 5.96 | 8.04 | 10.98 |
| Polar (128, 64) | 4.47 | 6.34 | 8.89 | 5.48 | 7.88 | 10.75 | X | X | X |
| | 5.12 | 7.36 | 10.48 | 6.16 | 8.81 | 11.91 | X | X | X |
| | 5.92 | 8.64 | 12.18 | 6.76 | 9.62 | 13.06 | X | X | X |
| Polar (128, 86) | 5.36 | 7.45 | 10.22 | 5.67 | 7.86 | 10.52 | 6.52 | 9.21 | 12.64 |
| | 5.75 | 8.16 | 11.29 | 6.02 | 8.22 | 11.31 | 7.09 | 10.20 | 13.84 |
| | 6.31 | 9.01 | 12.45 | 6.31 | 8.76 | 11.59 | 7.60 | 10.81 | 15.17 |
| Polar (128, 96) | 5.39 | 7.62 | 10.45 | 5.68 | 7.95 | 10.82 | 6.46 | 9.41 | 12.52 |
| | 5.88 | 8.33 | 11.49 | 6.00 | 8.44 | 11.51 | 6.83 | 9.99 | 13.36 |
| | 6.31 | 9.12 | 12.47 | 6.33 | 8.98 | 12.27 | 7.16 | 10.30 | 13.19 |
| LDPC (49, 24) | 5.74 | 8.13 | 11.30 | 5.24 | 7.47 | 10.31 | 5.87 | 8.22 | 11.56 |
| | 5.91 | 8.42 | 11.90 | 5.37 | 7.57 | 10.15 | 5.84 | 8.29 | 11.86 |
| | 6.13 | 8.71 | 12.10 | 5.39 | 7.53 | 10.66 | 5.88 | 8.27 | 11.42 |
| LDPC (121, 60) | 4.98 | 7.91 | 12.70 | 4.57 | 7.08 | 10.82 | 5.25 | 8.43 | 13.80 |
| | 5.02 | 7.94 | 12.72 | 4.60 | 7.21 | 11.07 | 5.32 | 8.69 | 13.82 |
| | 5.17 | 8.31 | 13.30 | 4.56 | 7.04 | 10.82 | 5.38 | 8.73 | 14.17 |
| LDPC (121, 70) | 6.11 | 9.62 | 15.10 | 5.51 | 8.46 | 12.31 | 6.49 | 10.39 | 15.43 |
| | 6.28 | 10.12 | 15.57 | 5.61 | 8.67 | 12.70 | 6.64 | 10.65 | 16.21 |
| | 6.40 | 10.21 | 16.11 | 5.70 | 8.66 | 12.91 | 6.79 | 11.13 | 16.93 |
| LDPC (121, 80) | 6.92 | 10.74 | 15.10 | 6.21 | 9.33 | 13.51 | 7.68 | 12.19 | 17.83 |
| | 7.17 | 11.21 | 16.31 | 6.30 | 9.52 | 13.78 | 7.39 | 11.46 | 17.65 |
| | 7.41 | 11.51 | 16.44 | 6.43 | 9.53 | 13.95 | 7.59 | 12.17 | 16.89 |
| MacKey (96, 48) | 6.88 | 9.86 | 13.40 | 6.32 | 8.78 | 11.73 | 7.86 | 11.61 | 15.51 |
| | 7.10 | 10.12 | 14.21 | 6.41 | 8.96 | 11.96 | 7.93 | 11.65 | 15.51 |
| | 7.38 | 10.72 | 14.83 | 6.39 | 8.96 | 12.22 | 8.12 | 11.88 | 15.93 |
| CCSDS (128, 64) | 6.34 | 9.80 | 14.40 | 5.92 | 8.74 | 12.11 | 7.28 | 11.66 | 17.00 |
| | 6.65 | 10.40 | 15.46 | 5.92 | 8.89 | 12.67 | 7.55 | 12.01 | 17.62 |
| | 6.88 | 10.90 | 15.90 | 5.93 | 8.95 | 12.63 | 7.81 | 12.48 | 17.66 |
| BCH (63, 36) | 4.42 | 5.91 | 8.01 | 4.76 | 6.46 | 8.79 | 5.01 | 6.84 | 9.30 |
| | 4.62 | 6.24 | 8.44 | 4.88 | 6.63 | 9.17 | 5.07 | 7.02 | 9.85 |
| | 4.86 | 6.65 | 9.10 | 5.22 | 7.23 | 9.91 | 5.11 | 7.09 | 9.82 |
| BCH (63, 45) | 5.16 | 7.02 | 9.75 | 5.21 | 7.22 | 9.93 | 5.49 | 7.71 | 10.86 |
| | 5.41 | 7.49 | 10.25 | 5.37 | 7.48 | 10.54 | 5.60 | 8.02 | 11.05 |
| | 5.60 | 7.79 | 10.93 | 5.47 | 7.64 | 10.71 | 5.61 | 7.94 | 11.36 |
| BCH (63, 51) | 5.20 | 7.08 | 9.65 | 5.16 | 7.12 | 9.97 | 5.35 | 7.49 | 10.38 |
| | 5.46 | 7.57 | 10.51 | 5.23 | 7.26 | 10.23 | 5.39 | 7.48 | 10.53 |
| | 5.66 | 7.89 | 11.01 | 5.24 | 7.35 | 10.16 | 5.26 | 7.40 | 10.49 |

Table 2 lists the results achieved for each of the error correction codes by the BP based algorithms (BP, AR BP) for 5 and 50 iterations in the first and second rows of each code, corresponding to a neural network with 10 and 100 layers, respectively. As in the performance evaluation of the ECCT presented herein before, the results of the transformer neural network based decoder 108A (ECCT) and the transformer neural network based decoder 108B employing reverse diffusion (DDECCT) are presented for six different architectures with N={2,6}, d={32,64,128} respectively listed in the first, second and third rows of each code. The columns designated 4, 5, 6 correspond to normalized SNR values $E_b/N_O$={4, 5, 6}.

As may be seen in table 2, the DDECCT outperforms the ECCT and of course all existing BP based decoders, which as demonstrated herein before are inferior to the ECCT, by significantly large margins on several codes at only a fraction of capacity and/or computation resources utilization.

Figure 15:
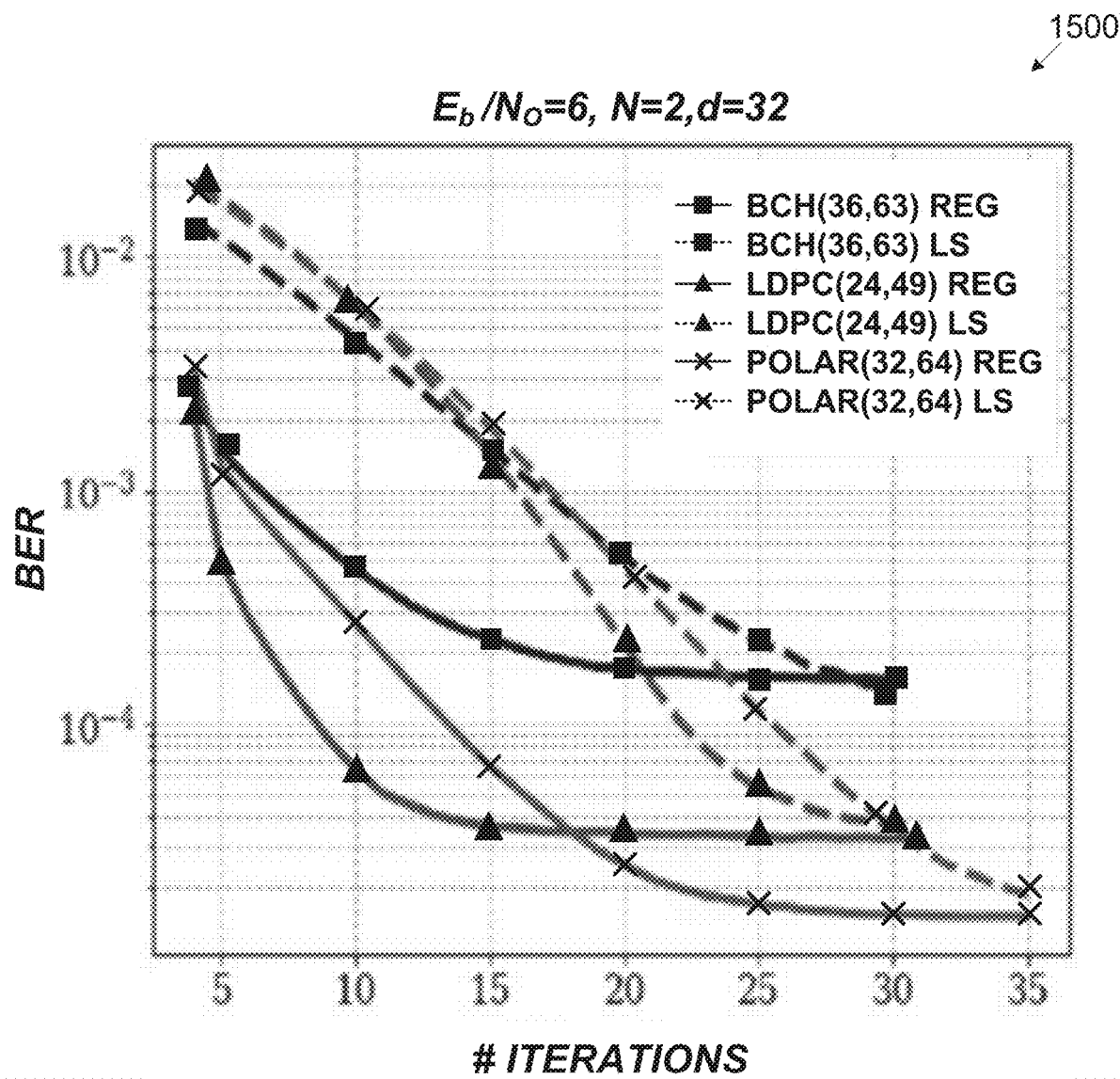
FIG. 15 is a graph chart illustrating BER and convergence of neural network based decoder employing reverse diffusion trained with a regular time steps distribution and an optimized time steps distribution, according to some embodiments of the present invention.

Reference is now made to FIG. 15, which is a graph chart illustrating BER and convergence of neural network based decoder employing reverse diffusion trained with a regular time steps distribution and an optimized time steps distribution, according to some embodiments of the present invention.

Graph chart 1500 presents a decoding accuracy difference for a transformer neural network based decoder 108B (DDECCT) employing reverse diffusion for encoding several error correction codes with a regular (e.g., random) distribution of the time steps (designated REG) compared to the same transformer neural network based decoder 108B (DDECCT) employing reverse diffusion with an optimized line search distribution of the time steps (designate LS).

In particular, the graph chart 1500 presents convergence of the REG DDECCT compared to the LS DDECCT, which is expressed by the number of iteration (up to n−k), to achieve substantially the same decoding performance (accuracy) which is expressed by BER.

Table 3 below further provides statistics (mean and standard deviation) of the convergence of the regular reverse diffusion and of the line search procedure applied to select an optimal time step size for one, two and three iteration steps. The $\Delta$ column denotes the difference between the logarithm of BER for three normalized SNR values, i.e., $\Delta = -\log BER_{LS} + \log BER_{REG}$.

The other columns represent rounded statistics (mean and standard deviation) of the number of iterations (#itr) of the reverse process to convergence, i.e., convergence to zero syndrome.

TABLE 3

| Code | Algorithm | | | | | | | | |
|---|---|---|---|---|---|---|---|---|---|
| | $\Delta$ (N = 2) | | | $\Delta$ (N = 6) | | | #Itr REG (N = 2) | | |
| | 4 | 5 | 6 | 4 | 5 | 6 | 4 | 5 | 6 |
| Polar (64, 32) | 0.05 | −0.02 | 0.22 | 0.04 | 0.04 | 0.41 | 13.4 ± 7.5 | 8.9 ± 6.3 | 5.4 ± 5.1 |
| | 0.00 | −0.14 | 0.01 | −0.04 | 0.21 | 0.89 | 13.1 ± 7.2 | 8.8 ± 6.2 | 5.4 ± 5.1 |
| | 0.13 | 0.19 | 0.31 | −0.11 | 0.07 | 0.65 | 13.0 ± 7.1 | 8.8 ± 6.1 | 5.4 ± 5.1 |
| Polar (64, 43) | 0.08 | 0.16 | 0.13 | 0.01 | 0.06 | 0.47 | 5.9 ± 4.9 | 3.2 ± 3.8 | 1.5 ± 2.7 |
| | 0.03 | 0.16 | 0.36 | −0.03 | 0.12 | 0.43 | 5.8 ± 4.8 | 3.2 ± 3.8 | 1.5 ± 2.7 |
| | 0.09 | 0.12 | 0.35 | −0.01 | 0.07 | 0.71 | 5.8 ± 4.8 | 3.3 ± 3.8 | 1.5 ± 2.7 |
| Polar (128, 64) | −0.10 | −0.11 | −0.20 | X | X | X | 26.6 ± 14.5 | 16.4 ± 9.3 | 10.2 ± 6.8 |
| | −0.11 | −0.02 | −0.33 | X | X | X | 24.3 ± 12.2 | 15.8 ± 8.3 | 10.1 ± 6.7 |
| | −0.05 | 0.00 | 0.00 | X | X | X | −1.0 ± −1.0 | −1.0 ± −1.0 | −1.0 ± −1.0 |
| Polar (128, 86) | −0.08 | −0.03 | −0.27 | −0.20 | −0.13 | −0.21 | 16.5 ± 10.8 | 9.0 ± 7.2 | 4.7 ± 4.9 |
| | −0.01 | −0.08 | 0.11 | −0.30 | −0.34 | −0.33 | 15.5 ± 10.0 | 8.7 ± 6.7 | 4.6 ± 4.8 |
| | −0.03 | −0.03 | −0.20 | −0.32 | −0.21 | −0.40 | 14.7 ± 9.2 | 8.6 ± 6.3 | 4.6 ± 4.7 |
| Polar (128, 96) | −0.01 | 0.00 | 0.00 | −0.11 | 0.04 | −0.16 | 12.6 ± 8.8 | 6.5 ± 5.9 | 3.1 ± 3.9 |
| | −0.02 | −0.13 | 0.13 | −0.19 | 0.13 | 0.14 | 11.8 ± 8.0 | 6.3 ± 5.4 | 3.1 ± 3.8 |
| | −0.07 | 0.06 | 0.11 | −0.15 | 0.00 | −0.13 | 11.1 ± 7.3 | 6.2 ± 5.2 | 3.1 ± 3.8 |
| LDPC (49, 24) | 0.00 | 0.19 | 0.10 | −0.05 | −0.31 | −0.16 | 11.4 ± 7.0 | 7.4 ± 5.7 | 4.5 ± 4.5 |
| | 0.11 | 0.14 | −0.20 | −0.13 | −0.12 | −0.20 | 11.4 ± 7.0 | 7.4 ± 5.7 | 4.5 ± 4.5 |
| | 0.08 | 0.12 | 0.30 | −0.12 | −0.13 | −0.41 | 11.4 ± 7.0 | 7.4 ± 5.6 | 4.5 ± 4.5 |
| LDPC (121, 60) | −0.05 | 0.02 | 0.02 | −0.07 | −0.30 | 0.00 | 26.7 ± 16.7 | 15.2 ± 8.8 | 9.4 ± 5.7 |
| | −0.04 | 0.03 | −0.11 | −0.11 | −0.09 | −0.44 | 26.7 ± 16.5 | 15.1 ± 8.6 | 9.3 ± 5.7 |
| | −0.07 | −0.14 | 0.01 | −0.18 | −0.47 | −0.23 | 26.6 ± 16.5 | 15.1 ± 8.5 | 9.4 ± 5.7 |
| LDPC (121, 70) | −0.07 | −0.02 | −0.31 | −0.19 | −0.20 | −1.00 | 17.8 ± 11.3 | 10.4 ± 6.2 | 6.1 ± 4.7 |
| | −0.04 | −0.02 | −0.25 | −0.16 | −0.44 | −0.17 | 17.6 ± 11.0 | 10.4 ± 6.1 | 6.2 ± 4.7 |
| | −0.02 | 0.01 | 0.00 | −0.18 | 0.00 | −0.11 | 17.5 ± 10.8 | 10.4 ± 6.1 | 6.1 ± 4.7 |
| LDPC (121, 80) | −0.18 | −0.21 | 0.00 | −0.33 | −0.46 | −0.95 | 12.5 ± 7.9 | 7.3 ± 4.9 | 4.0 ± 3.8 |
| | −0.12 | −0.05 | 0.00 | −0.15 | −0.42 | 0.81 | 12.4 ± 7.8 | 7.3 ± 4.9 | 4.0 ± 3.8 |

TABLE 3-continued

| Code | | | | | | | | | |
|---|---|---|---|---|---|---|---|---|---|
| | −0.01 | 0.00 | 0.00 | −0.28 | −0.21 | −0.27 | 12.4 ± 7.8 | 7.3 ± 4.9 | 4.0 ± 3.8 |
| MacKey (96, 48) | −0.05 | −0.04 | −0.17 | −0.09 | 0.29 | 0.00 | 15.4 ± 7.9 | 10.2 ± 5.5 | 6.5 ± 4.5 |
| | −0.07 | −0.05 | −0.36 | −0.17 | −0.21 | 0.00 | 15.3 ± 7.8 | 10.2 ± 5.4 | 6.5 ± 4.5 |
| | −0.16 | −0.06 | −0.13 | −0.19 | −0.33 | −0.13 | 15.3 ± 7.7 | 10.2 ± 5.4 | 6.5 ± 4.5 |
| CCSDS (128, 64) | −0.04 | −0.02 | −0.45 | −0.31 | −0.36 | 0.52 | 20.8 ± 11.5 | 13.1 ± 6.4 | 8.4 ± 5.0 |
| | −0.08 | −0.14 | 0.12 | −0.23 | −0.42 | 0.31 | 20.7 ± 11.3 | 13.1 ± 6.2 | 8.4 ± 4.9 |
| | −0.12 | −0.25 | −0.11 | −0.26 | −0.11 | 0.37 | 20.6 ± 11.1 | 13.0 ± 6.2 | 8.4 ± 4.9 |
| BCH (63, 36) | 0.04 | 0.03 | −0.05 | 0.01 | 0.00 | 0.09 | 12.5 ± 8.0 | 7.8 ± 6.7 | 4.3 ± 5.1 |
| | 0.01 | 0.00 | 0.22 | −0.11 | −0.05 | 0.03 | 12.3 ± 7.8 | 7.8 ± 6.6 | 4.3 ± 5.1 |
| | 0.05 | 0.14 | 0.12 | −0.11 | −0.02 | 0.04 | 12.0 ± 7.6 | 7.6 ± 6.4 | 4.3 ± 5.0 |
| BCH (63, 45) | 0.06 | 0.10 | −0.05 | −0.10 | −0.05 | 0.37 | 7.3 ± 5.7 | 4.1 ± 4.5 | 2.0 ± 3.2 |
| | 0.05 | 0.11 | 0.59 | −0.14 | 0.08 | 0.41 | 7.1 ± 5.6 | 4.0 ± 4.5 | 1.9 ± 3.2 |
| | 0.10 | 0.23 | 0.70 | −0.13 | −0.06 | 0.73 | 7.2 ± 5.6 | 4.0 ± 4.5 | 2.0 ± 3.2 |
| BCH (63, 51) | 0.11 | 0.32 | 0.88 | 0.09 | 0.42 | 1.16 | 4.8 ± 4.1 | 2.6 ± 3.4 | 1.2 ± 2.4 |
| | 0.10 | 0.33 | 1.06 | 0.06 | 0.28 | 1.19 | 4.8 ± 4.1 | 2.6 ± 3.4 | 1.2 ± 2.3 |
| | 0.09 | 0.41 | 0.87 | 0.02 | 0.34 | 1.04 | 4.8 ± 4.1 | 2.6 ± 3.4 | 1.2 ± 2.3 |

| | Algorithm | | | | | | | | |
|---|---|---|---|---|---|---|---|---|---|
| | #Itr REG (N = 6) | | | #Itr LS (N = 2) | | | #Itr LS (N = 6) | | |
| Code | 4 | 5 | 6 | 4 | 5 | 6 | 4 | 5 | 6 |
| Polar (64, 32) | 12.8 ± 6.8 | 8.8 ± 6.1 | 5.4 ± 5.1 | 3.2 ± 4.4 | 1.8 ± 2.4 | 1.1 ± 1.5 | 2.6 ± 3.0 | 1.7 ± 2.1 | 1.1 ± 1.5 |
| | 12.7 ± 6.7 | 8.8 ± 6.0 | 5.4 ± 5.1 | 2.9 ± 3.9 | 1.8 ± 2.4 | 1.1 ± 1.5 | 1.1 ± 0.8 | 0.9 ± 0.4 | 0.8 ± 0.4 |
| | 12.7 ± 6.7 | 8.8 ± 6.0 | 5.4 ± 5.1 | 2.8 ± 3.6 | 1.8 ± 2.2 | 1.1 ± 1.5 | 1.1 ± 0.7 | 0.9 ± 0.4 | 0.8 ± 0.4 |
| Polar (64, 43) | 5.7 ± 4.6 | 3.2 ± 3.8 | 1.5 ± 2.7 | 1.7 ± 2.7 | 0.8 ± 1.2 | 0.4 ± 0.6 | 1.2 ± 1.7 | 0.7 ± 0.9 | 0.4 ± 0.6 |
| | 5.7 ± 4.6 | 3.2 ± 3.7 | 1.5 ± 2.7 | 1.5 ± 2.4 | 0.7 ± 1.1 | 0.4 ± 0.6 | 0.9 ± 1.0 | 0.6 ± 0.6 | 0.4 ± 0.5 |
| | 5.7 ± 4.6 | 3.2 ± 3.7 | 1.5 ± 2.7 | 1.5 ± 2.3 | 0.7 ± 1.0 | 0.4 ± 0.6 | 1.0 ± 1.0 | 0.6 ± 0.4 | 0.4 ± 0.5 |
| Polar (128, 64) | X | X | X | 9.1 ± 13.7 | 3.5 ± 5.9 | 2.1 ± 2.8 | X | X | X |
| | X | X | X | 6.8 ± 9.8 | 3.4 ± 4.2 | 2.1 ± 2.5 | X | X | X |
| | X | X | X | −1.0 ± −1.0 | −1.0 ± −1.0 | −1.0 ± −1.0 | X | X | X |
| Polar (128, 86) | 13.4 ± 7.5 | 8.3 ± 5.8 | 4.6 ± 4.6 | 5.6 ± 9.6 | 2.1 ± 4.0 | 1.0 ± 1.6 | 2.9 ± 4.4 | 1.6 ± 2.1 | 1.0 ± 1.2 |
| | 13.1 ± 6.9 | 8.3 ± 5.7 | 4.6 ± 4.6 | 4.8 ± 8.5 | 2.0 ± 3.6 | 1.0 ± 1.5 | 1.3 ± 2.4 | 1.0 ± 0.6 | 0.7 ± 0.5 |
| | 13.0 ± 6.6 | 8.3 ± 5.7 | 4.6 ± 4.6 | 4.1 ± 7.3 | 1.8 ± 2.9 | 1.0 ± 1.4 | 1.2 ± 1.9 | 0.9 ± 0.5 | 0.7 ± 0.5 |
| Polar (128, 96) | 10.5 ± 6.4 | 6.1 ± 5.0 | 3.1 ± 3.8 | 4.5 ± 7.7 | 1.5 ± 3.0 | 0.7 ± 1.1 | 2.3 ± 3.4 | 1.2 ± 1.4 | 0.7 ± 0.8 |
| | 10.3 ± 6.1 | 6.1 ± 4.9 | 3.1 ± 3.8 | 3.6 ± 6.4 | 1.4 ± 2.3 | 0.7 ± 0.9 | 1.2 ± 2.0 | 0.9 ± 0.5 | 0.6 ± 0.5 |
| | 10.2 ± 5.9 | 6.1 ± 4.9 | 3.1 ± 3.8 | 2.9 ± 5.0 | 1.3 ± 1.8 | 0.7 ± 0.9 | 1.1 ± 1.5 | 0.9 ± 0.5 | 0.6 ± 0.5 |
| LDPC (49, 24) | 10.9 ± 6.3 | 7.3 ± 5.4 | 4.5 ± 4.5 | 3.0 ± 5.3 | 1.4 ± 2.1 | 0.8 ± 0.9 | 2.2 ± 3.6 | 1.3 ± 1.5 | 0.8 ± 0.8 |
| | 10.9 ± 6.3 | 7.3 ± 5.4 | 4.5 ± 4.5 | 2.8 ± 5.0 | 1.4 ± 2.0 | 0.8 ± 0.9 | 1.5 ± 3.5 | 0.9 ± 1.1 | 0.7 ± 0.5 |
| | 10.9 ± 6.3 | 7.3 ± 5.4 | 4.5 ± 4.5 | 2.8 ± 4.9 | 1.4 ± 2.0 | 0.8 ± 0.9 | 1.4 ± 3.4 | 0.9 ± 1.1 | 0.7 ± 0.5 |
| LDPC (121, 60) | 21.9 ± 11.5 | 14.4 ± 6.5 | 9.3 ± 5.6 | 11.4 ± 20.3 | 3.1 ± 6.8 | 1.6 ± 1.6 | 6.0 ± 13.3 | 2.3 ± 3.1 | 1.5 ± 1.1 |
| | 21.7 ± 11.2 | 14.4 ± 6.5 | 9.3 ± 5.6 | 11.4 ± 20.2 | 3.0 ± 6.6 | 1.6 ± 1.5 | 4.4 ± 13.2 | 1.3 ± 2.6 | 1.0 ± 0.4 |
| | 21.5 ± 10.8 | 14.4 ± 6.4 | 9.3 ± 5.6 | 11.1 ± 20.0 | 3.1 ± 6.8 | 1.6 ± 1.5 | 4.2 ± 12.7 | 1.3 ± 2.5 | 1.0 ± 0.3 |

TABLE 3-continued

| | | | | | | | | | |
|---|---|---|---|---|---|---|---|---|---|
| LDPC (121, 70) | 15.5 ± 7.4 | 10.2 ± 5.5 | 6.1 ± 4.7 | 5.5 ± 12.1 | 1.8 ± 3.4 | 1.1 ± 0.9 | 2.0 ± 6.7 | 1.0 ± 1.1 | 0.9 ± 0.4 |
| | 15.5 ± 7.3 | 10.2 ± 5.5 | 6.1 ± 4.7 | 5.3 ± 11.6 | 1.8 ± 3.0 | 1.1 ± 0.8 | 1.9 ± 6.2 | 1.0 ± 0.9 | 0.9 ± 0.4 |
| | 15.4 ± 7.1 | 10.2 ± 5.5 | 6.1 ± 4.7 | 5.3 ± 11.5 | 1.8 ± 3.0 | 1.1 ± 0.9 | 1.8 ± 5.7 | 1.0 ± 0.7 | 0.9 ± 0.4 |
| LDPC (121, 80) | 11.4 ± 5.6 | 7.2 ± 4.7 | 4.0 ± 3.8 | 3.2 ± 7.3 | 1.3 ± 1.8 | 0.8 ± 0.6 | 1.2 ± 3.0 | 0.9 ± 0.4 | 0.7 ± 0.4 |
| | 11.4 ± 5.8 | 7.2 ± 4.7 | 4.0 ± 3.8 | 3.2 ± 7.4 | 1.3 ± 1.8 | 0.8 ± 0.6 | 1.4 ± 3.7 | 0.9 ± 0.6 | 0.7 ± 0.4 |
| | 11.4 ± 5.6 | 7.2 ± 4.7 | 4.0 ± 3.8 | 3.0 ± 6.9 | 1.3 ± 1.7 | 0.8 ± 0.6 | 1.3 ± 3.2 | 0.9 ± 0.5 | 0.7 ± 0.4 |
| MacKey (96, 48) | 14.4 ± 5.7 | 10.5 ± 5.0 | 6.4 ± 4.4 | 3.4 ± 7.5 | 1.7 ± 2.5 | 1.1 ± 0.9 | 2.2 ± 2.9 | 1.5 ± 0.9 | 1.1 ± 0.6 |
| | 14.3 ± 5.7 | 10.5 ± 5.0 | 6.4 ± 4.4 | 3.3 ± 7.2 | 1.6 ± 2.4 | 1.1 ± 0.8 | 1.3 ± 2.6 | 1.0 ± 0.5 | 0.9 ± 0.3 |
| | 14.3 ± 5.6 | 10.5 ± 5.0 | 6.4 ± 4.4 | 3.3 ± 7.2 | 1.6 ± 2.3 | 1.1 ± 0.8 | 1.1 ± 2.3 | 1.0 ± 0.4 | 0.9 ± 0.3 |
| CCSDS (128, 64) | 18.2 ± 6.6 | 12.8 ± 5.4 | 8.4 ± 4.9 | 5.5 ± 12.2 | 2.2 ± 3.6 | 1.4 ± 1.1 | 1.7 ± 4.7 | 1.1 ± 0.7 | 1.0 ± 0.3 |
| | 18.1 ± 6.4 | 12.8 ± 5.4 | 8.4 ± 4.9 | 5.3 ± 11.9 | 2.1 ± 3.2 | 1.4 ± 1.0 | 1.6 ± 4.1 | 1.1 ± 0.6 | 1.0 ± 0.3 |
| | 18.1 ± 6.3 | 12.8 ± 5.4 | 8.4 ± 4.9 | 5.3 ± 11.4 | 2.1 ± 3.0 | 1.4 ± 0.9 | 1.6 ± 3.7 | 1.1 ± 0.5 | 1.0 ± 0.3 |
| BCH (63, 36) | 11.9 ± 7.5 | 7.6 ± 6.4 | 4.3 ± 5.0 | 5.1 ± 7.6 | 2.3 ± 4.2 | 1.0 ± 2.0 | 4.3 ± 6.8 | 2.0 ± 3.6 | 1.0 ± 1.8 |
| | 11.8 ± 7.4 | 7.5 ± 6.3 | 4.3 ± 5.0 | 4.8 ± 7.2 | 2.2 ± 4.0 | 1.0 ± 1.9 | 2.5 ± 5.6 | 1.1 ± 2.4 | 0.7 ± 0.8 |
| | 11.7 ± 7.3 | 7.5 ± 6.3 | 4.3 ± 5.0 | 4.2 ± 6.3 | 2.0 ± 3.4 | 1.0 ± 1.7 | 2.5 ± 5.6 | 1.1 ± 2.3 | 0.7 ± 0.8 |
| BCH (63, 45) | 6.9 ± 5.3 | 4.0 ± 4.4 | 1.9 ± 3.2 | 2.5 ± 4.1 | 1.0 ± 1.9 | 0.5 ± 0.8 | 1.5 ± 3.0 | 0.7 ± 1.1 | 0.4 ± 0.5 |
| | 6.8 ± 5.2 | 3.9 ± 4.3 | 2.0 ± 3.2 | 2.3 ± 3.9 | 1.0 ± 1.7 | 0.5 ± 0.8 | 1.4 ± 2.6 | 0.7 ± 0.9 | 0.4 ± 0.5 |
| | 6.8 ± 5.2 | 3.9 ± 4.3 | 2.0 ± 3.2 | 2.2 ± 3.9 | 1.0 ± 1.7 | 0.5 ± 0.8 | 1.3 ± 2.5 | 0.7 ± 1.0 | 0.4 ± 0.5 |
| BCH (63, 51) | 4.7 ± 4.0 | 2.6 ± 3.4 | 1.2 ± 2.4 | 1.9 ± 3.0 | 0.7 ± 1.4 | 0.3 ± 0.6 | 1.6 ± 2.6 | 0.7 ± 1.2 | 0.3 ± 0.6 |
| | 4.7 ± 4.0 | 2.6 ± 3.3 | 1.2 ± 2.4 | 1.8 ± 2.9 | 0.7 ± 1.3 | 0.3 ± 0.6 | 1.3 ± 2.1 | 0.6 ± 1.0 | 0.3 ± 0. |
| | 4.7 ± 4.0 | 2.6 ± 3.3 | 1.2 ± 2.3 | 1.8 ± 2.8 | 0.7 ± 1.3 | 0.3 ± 0.6 | 1.4 ± 2.3 | 0.6 ± 1.0 | 0.3 ± 0.5 |

As can be seen from graph chart 1500 and table 3, the LS DDECCT enables extremely fast convergence, up to one iteration for high SNR. Since in this experiment the decoding training is not stopped early even in case the decoder stagnates, the average number of iterations may be in fact further reduced.

Moreover, the LS DDECCT outperforms the original ECCT even with only one step. Also, the performance of the LS DDECCT with only three iterations (i.e., equivalent to 6 layers) almost reaches the performance of the 6 layers ECCT while utilizing only 1/3/3 of the capacity, i.e., computation resources.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant systems, methods and computer programs will be developed and the scope of the terms error correction code, neural network, and error correction code decoding model are intended to include all such new technologies a priori.

As used herein the term "about" refers to ☐10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, an instance or an illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals there between.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A method of training a neural network based decoder for decoding error correction codes, comprising:
    using at least one processor for:
        obtaining a plurality of training samples comprising at least one codeword encoded using an error correction code and transmitted over a transmission channel, the plurality of training samples are subject to gradual interference over a plurality of time steps and associate the at least one encoded codeword with an interference level and a parity check syndrome at each of the plurality of time steps;
        using the plurality of training samples to train a neural network based decoder to decode codewords encoded using an error correction code by:
            estimating a multiplicative interference included in the at least one encoded codeword based on reverse diffusion applied to the at least one encoded codeword across the plurality of time steps,
            computing an additive interference included in the at least one encoded codeword based on the estimated multiplicative interference, and
            recovering the at least one codeword by removing the additive interference; and
        outputting the trained neural network based decoder for decoding at least one codeword encoded using an error correction code.

2. The method of claim 1, wherein a distribution of the plurality of time steps over time is selected randomly.

3. The method of claim 1, further comprising optimizing a distribution of the plurality of time steps over time by applying an iterative process to identify an optimal time step size which minimizes the parity check syndrome for the recovered at least one codeword.

4. The method of claim 3, further comprising applying grid search to restrict a search space for selecting the distribution of the plurality of time steps over time.

5. The method of claim 1, wherein the neural network based decoder is implemented using at least one transformer neural network conditioned for the error correction code according to a number of parity errors detected in the at least one codeword, the transformer neural network is conditioned by employing a multi-dimension one hot decoding to a Hadamard product of an initial embedding created for the bits of the at least one codeword.

6. The method of claim 1, wherein the at least one encoded codeword encodes the zero codeword.

7. A system for training a neural network based decoder for decoding error correction codes, comprising:
    at least one processor configured to execute a code, the code comprising:
        code instructions to obtain obtaining a plurality of training samples comprising at least one codeword encoded using an error correction code and transmitted over a transmission channel, the plurality of training samples are subject to gradual interference over a plurality of time steps and associate the at least one encoded codeword with an interference level and a parity check syndrome at each of the plurality of time steps;
        code instructions to use the plurality of training samples to train a neural network based decoder to decode codewords encoded using an error correction code by:
            estimating a multiplicative interference included in the at least one encoded codeword based on reverse diffusion applied to the at least one encoded codeword across the plurality of time steps,
            computing an additive interference included in the at least one encoded codeword based on the estimated multiplicative interference, and
            recovering the at least one codeword by removing the additive interference; and
        code instructions to output the trained neural network based decoder for decoding at least one codeword encoded using an error correction code.

8. A method of using a neural network based decoder trained for decoding error correction codes, comprising:
    using at least one processor for:

receiving at least one codeword encoded using an error correction code and transmitted over a transmission channel;

recovering the at least one encoded codeword by applying to it at least one neural network based decoder trained to decode codewords encoded using the error correction code; and outputting the at least one recovered codeword;

wherein the at least one neural network based decoder is trained using a plurality of training samples, the plurality of training samples comprise at least one codeword encoded using the error correction code and transmitted over a transmission channel, the plurality of training samples are subject to gradual interference over a plurality of time steps and associate the at least one encoded codeword with an interference level and a parity check syndrome at each of the plurality of time steps, the at least one neural network based decoder is trained to decode the at least one encoded codeword by:

estimating a multiplicative interference included in the at least one encoded codeword based on reverse diffusion applied to the at least one encoded codeword across the plurality of time steps, computing an additive interference included in the at least one encoded codeword based on the estimated multiplicative interference, and recovering the at least one codeword by removing the additive interference.

* * * * *